US012683558B2

(12) United States Patent
Yu et al.

(10) Patent No.: US 12,683,558 B2
(45) Date of Patent: Jul. 14, 2026

(54) MODEL ARCHITECTURE SEARCH AND OPTIMIZATION FOR HARDWARE

(71) Applicant: Analog Devices, Inc., Wilmington, MA (US)

(72) Inventors: Tao Yu, Somerville, MA (US); Cristobal Alessandri, Boston, MA (US); Frank Yaul, Somerville, MA (US); Wenjie Lu, Arlington, MA (US); Shyam Chandrasekhar Nambiar, Boston, MA (US)

(73) Assignee: Analog Devices, Inc., Wilmington, MA (US)

( * ) Notice: Subject to any disclaimer, the term of this patent is extended or adjusted under 35 U.S.C. 154(b) by 859 days.

(21) Appl. No.: 17/732,715

(22) Filed: Apr. 29, 2022

(65) Prior Publication Data

US 2022/0376659 A1 Nov. 24, 2022

Related U.S. Application Data

(60) Provisional application No. 63/187,536, filed on May 12, 2021.

(51) Int. Cl.
*H03F 1/32* (2006.01)
*G06F 18/24* (2023.01)
(Continued)

(52) U.S. Cl.
CPC ........... *H03F 1/3247* (2013.01); *G06F 18/24* (2023.01); *G06N 3/08* (2013.01); *H03F 1/3211* (2013.01)

(58) Field of Classification Search
CPC ................. H03F 1/3247; H03F 1/3211; H03F 2201/3224; H03F 1/3258; H03F 2200/451;
(Continued)

(56) References Cited

U.S. PATENT DOCUMENTS 8,326,239 B1 12/2012 Peiris et al.
9,160,280 B1 10/2015 Abdelhafiz et al.
(Continued)

FOREIGN PATENT DOCUMENTS

CN 101056288 A 10/2007
CN 109155637 A 4/2019
(Continued)

OTHER PUBLICATIONS

Chih-Lin et al., "A Deep Learning Enabled Universal DPD System", 2020 IEEE International Electron Devices Meeting (IEDM), Dec. 2020, 3 pages.
(Continued)

*Primary Examiner* — Hieu P Nguyen
(74) *Attorney, Agent, or Firm* — ArentFox Schiff LLP

(57) ABSTRACT

Systems, devices, and methods related to using model architecture search for hardware configuration are provided. An example apparatus includes an input node to receive an input signal; a pool of processing units to perform one or more arithmetic operations and one or more signal selection operations, wherein each of the processing units in the pool is associated with at least one parameterized model corresponding to a data transformation operation; and a control block to configure, based on a first parameterized model, a first subset of the processing units in the pool, where the first subset of the processing units processes the input signal to generate a first signal.

20 Claims, 18 Drawing Sheets

(51) Int. Cl.
*G06K 9/62* (2022.01)
*G06N 3/08* (2023.01)
*H03F 1/30* (2006.01)

(58) Field of Classification Search
CPC .... H03F 2201/3233; H03F 3/189; H03F 3/24; G06F 18/24; G06F 18/24143; G06N 3/08; G06N 3/04; G06N 3/084
USPC ........................................................ 330/149
See application file for complete search history.

(56) References Cited

U.S. PATENT DOCUMENTS

| | | | |
|---|---|---|---|
| 9,590,567 | B2 | 3/2017 | Zhao et al. |
| 10,320,340 | B1 | 6/2019 | Pratt et al. |
| 10,469,109 | B2 | 11/2019 | Gutman et al. |
| 10,581,469 | B1 | 3/2020 | O'Shea et al. |
| 11,018,704 | B1 | 5/2021 | O'Shea et al. |
| 11,648,962 | B1 | 5/2023 | Crego et al. |
| 12,040,753 | B2 | 7/2024 | Yu et al. |
| 2005/0001684 | A1 | 1/2005 | Braithwaite |
| 2007/0288222 | A1 | 12/2007 | Eilam et al. |
| 2008/0130789 | A1 | 6/2008 | Copeland et al. |
| 2013/0243122 | A1 | 9/2013 | Bai |
| 2013/0343483 | A1 | 12/2013 | Bai |
| 2015/0103952 | A1 | 4/2015 | Wang et al. |
| 2015/0214904 | A1 | 7/2015 | Lozhkin |
| 2016/0285485 | A1 | 9/2016 | Fehri et al. |
| 2017/0047952 | A1 | 2/2017 | Kim et al. |
| 2017/0085281 | A1 | 3/2017 | Dou et al. |
| 2018/0034422 | A1 | 2/2018 | Roeschke et al. |
| 2018/0167092 | A1 | 6/2018 | Hausmair et al. |
| 2019/0026639 | A1 | 1/2019 | Vasudevan et al. |
| 2019/0348956 | A1 | 11/2019 | Megretski et al. |
| 2020/0259465 | A1 | 8/2020 | Wu et al. |
| 2020/0295975 | A1 | 9/2020 | Li et al. |
| 2020/0382147 | A1 | 12/2020 | Menkhoff et al. |
| 2021/0110272 | A1 | 4/2021 | Guo et al. |
| 2021/0218414 | A1 | 7/2021 | Malhotra et al. |
| 2021/0284184 | A1 | 9/2021 | Song et al. |
| 2021/0295163 | A1 | 9/2021 | Zoph et al. |
| 2021/0391832 | A1 | 12/2021 | Barbu et al. |
| 2022/0200540 | A1 | 6/2022 | Kof et al. |
| 2022/0255786 | A1 | 8/2022 | McCormick et al. |
| 2022/0376659 | A1 | 11/2022 | Yu et al. |
| 2022/0376719 | A1 | 11/2022 | Yu et al. |
| 2022/0383859 | A1 | 12/2022 | Mimassi |
| 2023/0006611 | A1 | 1/2023 | Chen et al. |
| 2023/0033203 | A1 | 2/2023 | Liu et al. |
| 2023/0268942 | A1* | 8/2023 | Ghannouchi .......... H04B 10/00 375/297 |

FOREIGN PATENT DOCUMENTS

| | | | |
|---|---|---|---|
| CN | 117060864 | A | 11/2023 |
| EP | 2538553 | A1 | 12/2012 |
| EP | 3133734 | B1 | 6/2018 |
| EP | 4277127 | A1 | 11/2023 |
| JP | 2013-542696 | A | 11/2013 |
| JP | 2015-142325 | A | 8/2015 |
| JP | 2016-123095 | A | 7/2016 |
| JP | 2018-521581 | A | 8/2018 |
| JP | 2020-017884 | A | 1/2020 |
| JP | 2020-031335 | A | 2/2020 |
| KR | 101058733 | B1 | 8/2011 |
| KR | 1020210050961 | A | 5/2021 |
| WO | 2012/066382 | A1 | 5/2012 |
| WO | 2017/003534 | A1 | 1/2017 |
| WO | 2019233558 | A1 | 12/2019 |
| WO | 2020/220715 | A1 | 11/2020 |
| WO | 2022/137642 | A1 | 6/2022 |

OTHER PUBLICATIONS

Chu et al., "A Cascaded Memory Polynomial-Neural Network Behavior Model For Digital Predistortion", 2020 IEEE MTT-S International Conference on Numerical Electromagnetic and Multiphysics Modeling and Optimization (NEMO), Dec. 7, 2020, 3 pages.

Cioba et al., "Efficient Attention Guided 5G Power Amplifier Digital Predistortion", https://arxiv.org/pdf/2003.13361, Mar. 30, 2020, 5 pages.

Yu et al., "Polynomial-Assisted Neural Network Behavioral Model of Wideband Radio Frequency Power Amplifiers for 5G New Radio", 2020 IEEE MTT-S International Conference on Numerical Electromagnetic and Multiphysics Modeling and Optimization (NEMO), Dec. 7, 2020, 4 pages.

Extended European Search Report received for European Patent Application No. 22808115.4, mailed on Oct. 10, 2024, 14 pages.

Extended European Search Report received for European Patent Application No. 22808116.2, mailed on Oct. 11, 2024, 12 pages.

Extended European Search Report received for Patent Application No. 22808114.7, mailed on Oct. 11, 2024, 16 pages.

International Search Report and Written Opinion in PCT/US2022/028292, mailed Aug. 29, 2022, 14 pages.

International Search Report and Written Opinion in PCT/US2022/028293, mailed Aug. 12, 2022, 8 pages.

International Search Report and Written Opinion in PCT/US2022/028294, mailed Aug. 26, 2022, 9 pages.

Rawat et al., "Adaptive Digital Predistortion of Wireless Power Amplifiers/Transmitters Using Dynamic Real-Value Focused Time-Delay Line Neural Networks," IEEE Transactions on Microwave Theory and Techniques, Nov. 24, 2009, vol. 58, Issue 1, pp. 95-104.

Bertsimas et al., "Best Subset Selection via a Modern Optimization Lens", arXiv: 1507.03133v1, Jul. 11, 2015, pp. 1-63.

Hastie et al., "Best Subset, Forward Stepwise or Lasso? Analysis and Recommendations Based on Extensive Comparisons", Statistical Science, vol. 35, No. 4, 2020, pp. 579-592.

Hastie et al., "Extended Comparisons of Best Subset Selection, Forward Stepwise Selection, and the Lasso", arXiv:1707.08692v2, Jul. 29, 2017, pp. 1-53.

Pilanci et al., "Sparse learning via Boolean relaxations", Math. Program., Ser. B, 151, Mar. 31, 2015, pp. 63-87.

Tibshirani, Robert, "Regression Shrinkage and Selection via the Lasso", Journal of the Royal Statistical Society, Series B (Methodological), vol. 58, No. 1, 1996, pp. 267-288.

Liu et al., "DARTS: Differentiable Architecture Search", Conference paper at ICLR 2019, Dec. 21, 2018, pp. 1-13.

* cited by examiner

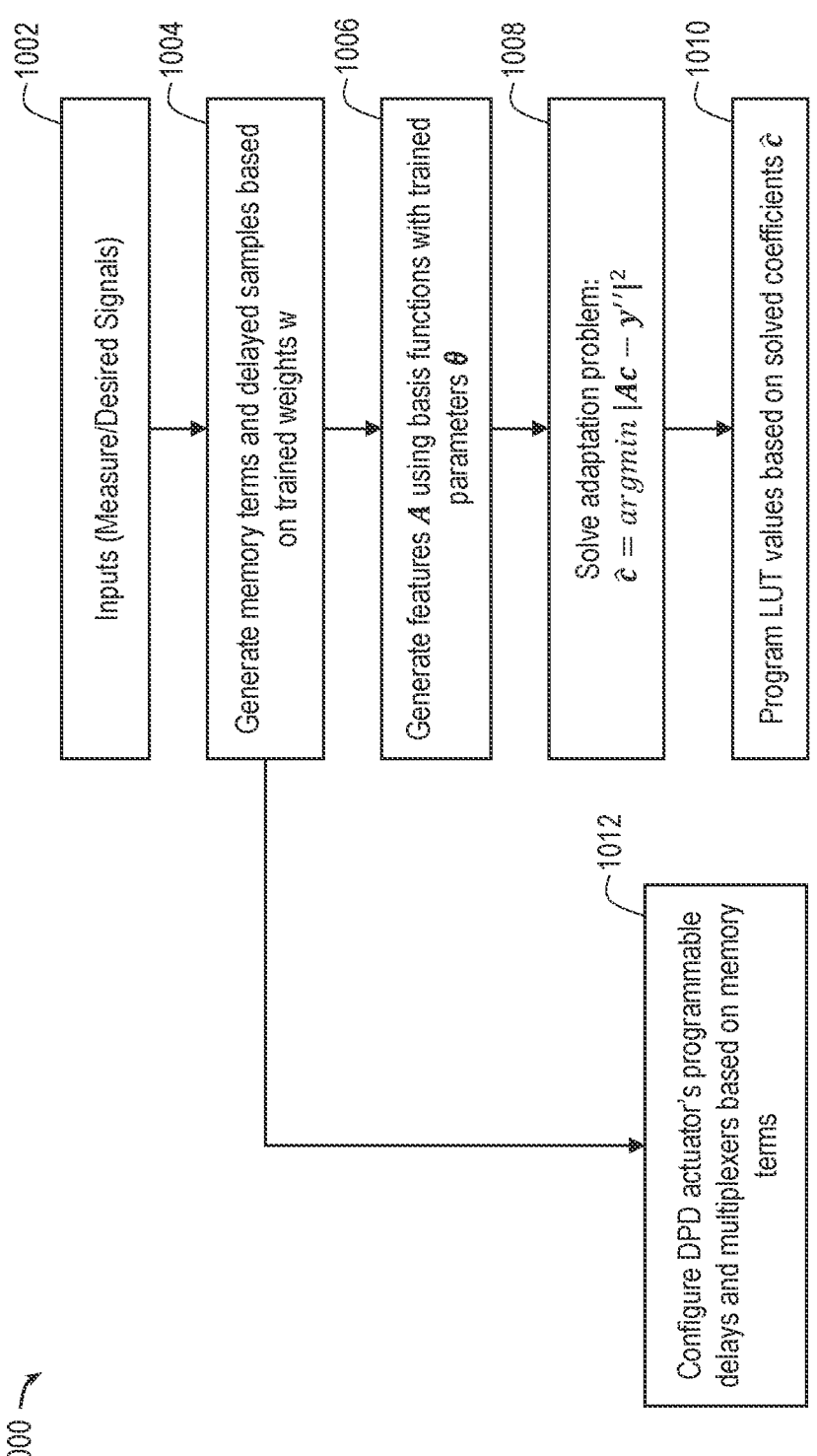

1000

1002 — Inputs (Measure/Desired Signals)

1004 — Generate memory terms and delayed samples based on trained weights w

1006 — Generate features A using basis functions with trained parameters θ

1008 — Solve adaptation problem: $\hat{c} = argmin\ |Ac - y''|^2$

1010 — Program LUT values based on solved coefficients $\hat{c}$

1012 — Configure DPD actuator's programmable delays and multiplexers based on memory terms

FIG. 10

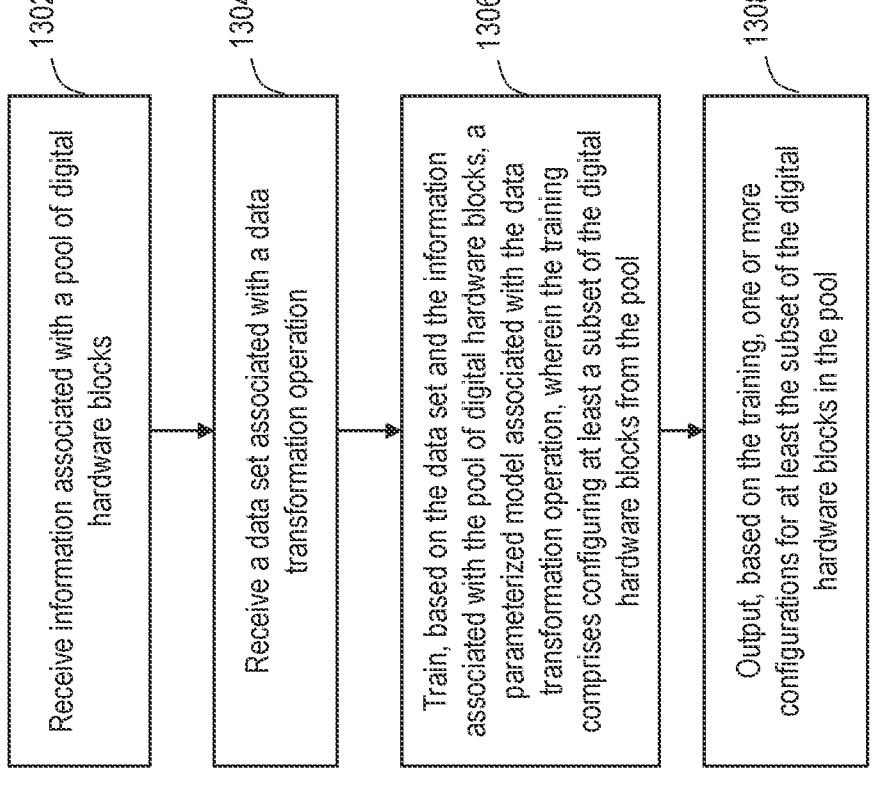

1302

Receive information associated with a pool of digital hardware blocks

1304

Receive a data set associated with a data transformation operation

1306

Train, based on the data set and the information associated with the pool of digital hardware blocks, a parameterized model associated with the data transformation operation, wherein the training comprises configuring at least a subset of the digital hardware blocks from the pool

1308

Output, based on the training, one or more configurations for at least the subset of the digital hardware blocks in the pool

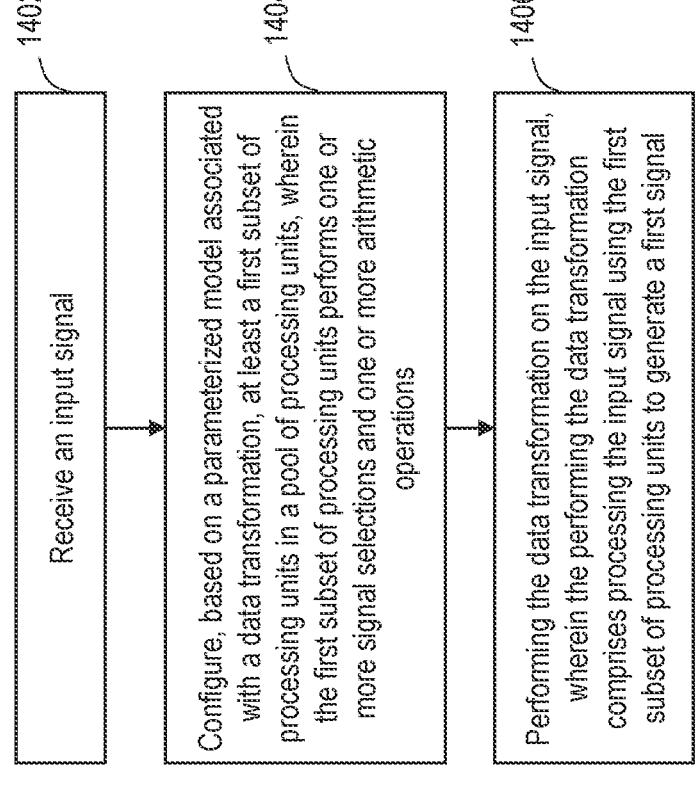

1402

Receive an input signal

1404

Configure, based on a parameterized model associated with a data transformation, at least a first subset of processing units in a pool of processing units, wherein the first subset of processing units performs one or more signal selections and one or more arithmetic operations

1406

Performing the data transformation on the input signal, wherein the performing the data transformation comprises processing the input signal using the first subset of processing units to generate a first signal

MODEL ARCHITECTURE SEARCH AND OPTIMIZATION FOR HARDWARE

CROSS REFERENCE TO RELATED APPLICATIONS

The present application claims priority to and the benefit of the U.S. Provisional Patent Application No. 63/187,536 entitled "DIGITAL PREDISTORTION FOR POWER AMPLIFIER LINEARIZATION USING NEURAL NETWORKS" and filed May 12, 2021, which is hereby incorporated by reference in its entirety as if fully set forth below and for all applicable purposes.

TECHNICAL FIELD OF THE DISCLOSURE

The present disclosure generally relates to electronics, and more particularly to configuring hardware blocks (e.g., digital predistortion (DPD) hardware for linearization of power amplifier) using model architecture search techniques (e.g., neural architecture search (NAS)).

BACKGROUND

RF systems are systems that transmit and receive signals in the form of electromagnetic waves in the RF range of approximately 3 kilohertz (kHz) to 300 gigahertz (GHz). RF systems are commonly used for wireless communications, with cellular/wireless mobile technology being a prominent example, but may also be used for cable communications such as cable television. In both of these types of systems, linearity of various components therein plays a crucial role.

Linearity of an RF component or a system such as an RF transceiver is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

Made from semiconductor materials, which are inherently nonlinear, and having to operate at relatively high power levels, power amplifiers (PAs) are usually the first components to analyze when considering a design of an RF system in terms of linearity. PA outputs with nonlinear distortions can result in reduced modulation accuracy (e.g., reduced error vector magnitude (EVM)) and/or out-of-band emissions. Therefore, both wireless RF systems (e.g., Long Term Evolution (LTE) and millimeter-wave or 5th generation (5G) systems) and cable RF systems have stringent specifications on PA linearity.

DPD can be applied to enhance linearity of a PA. Typically, DPD involves applying, in the digital domain, predistortion to a signal to be provided as an input to a PA to reduce and/or cancel distortion that is expected to be caused by the PA. The predistortion can be characterized by a PA model. The PA model can be updated based on the feedback from the PA (i.e., based on the output of the PA). The more accurate a PA model is in terms of predicting the distortions that the PA will introduce, the more effective the predistortion of an input to the PA will be in terms of reducing the effects of the distortion caused by the amplifier.

Performing DPD in RF systems is not an easy task because a variety of factors can affect the cost, quality and robustness of DPD. Physical constraints such as space/surface area and also regulations can pose further constraints to the requirements or specifications of DPD. DPD becomes particularly challenging because of ever-increasing sampling rates used in state-of-the-art RF systems, and thus trade-off and ingenuity have to be exercised in designing DPD.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 10 provides a flow diagram illustrating an exemplary method for performing DPD operations for online actuation and adaptation, according to some embodiments of the present disclosure;

FIG. 13 provides a flow diagram illustrating a method for training a parameterized model mapped to a target hardware, according to some embodiments of the present disclosure;

FIG. 14 provides a flow diagram illustrating a method for performing operations on a target hardware configured based on a parameterized model, according to some embodiments of the present disclosure;

DESCRIPTION OF EXAMPLE EMBODIMENTS OF THE DISCLOSURE

Overview

Figure 1A:
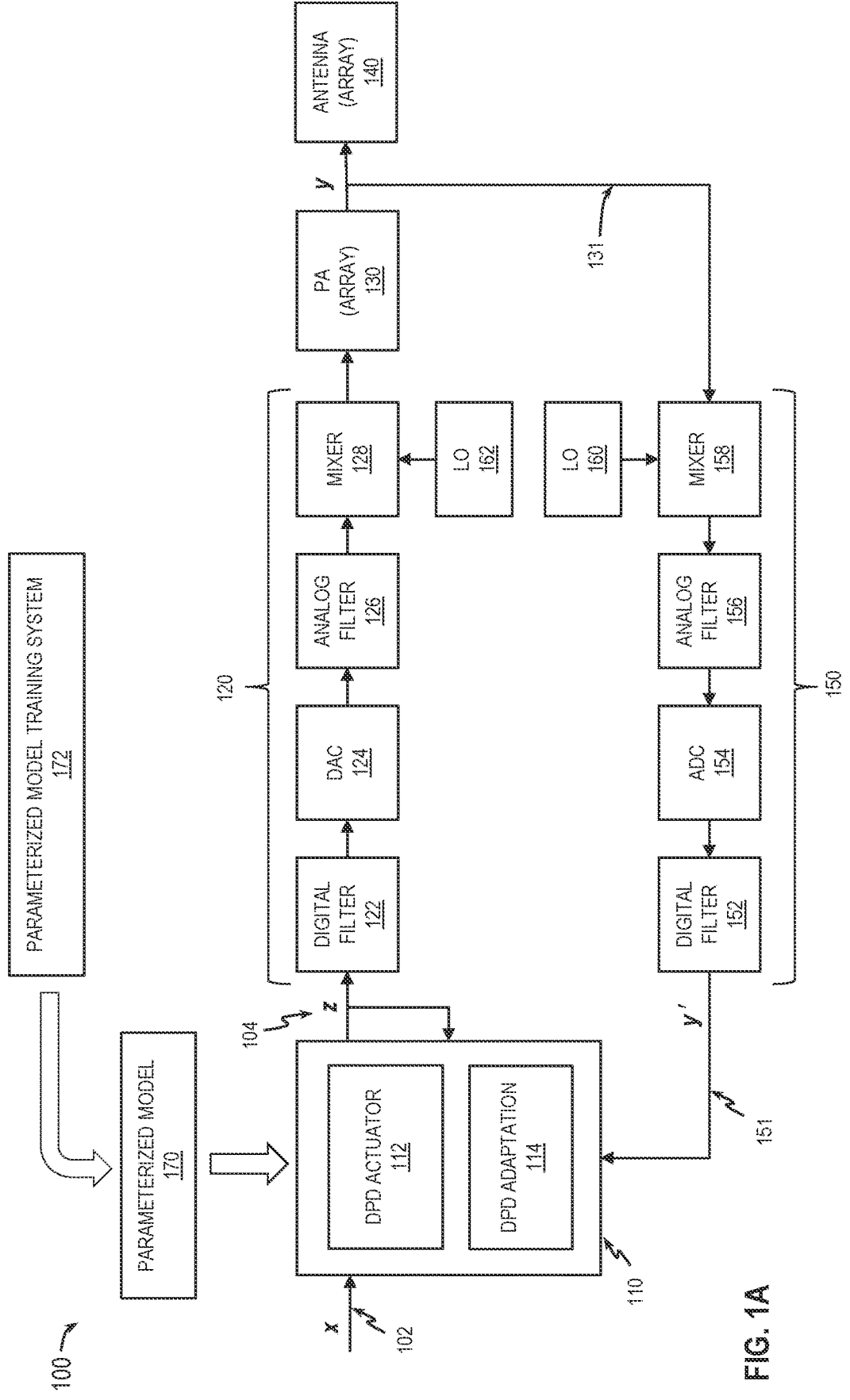
FIG. 1A provides a schematic block diagram of an exemplary radio frequency (RF) transceiver in which parameterized model-based digital predistortion (DPD) may be implemented, according to some embodiments of the present disclosure.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

For purposes of illustrating DPD using neural networks, proposed herein, it might be useful to first understand phenomena that may come into play in RF systems. The following foundational information may be viewed as a basis from which the present disclosure may be properly explained. Such information is offered for purposes of explanation only and, accordingly, should not be construed in any way to limit the broad scope of the present disclosure and its potential applications.

As described above, PAs are usually the first components to analyze when considering a design of an RF system in terms of linearity. Having linear and efficient PAs is essential for wireless and cable RF systems. While linearity is also important for small-signal amplifiers such as low-noise amplifiers, the challenges of linearity are particularly pronounced for PAs because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

As also described above, DPD can pre-distort an input to a PA to reduce and/or cancel distortion caused by the amplifier. To realize this functionality, at a high level, DPD involves forming a model of how a PA may affect an input signal, the model defining coefficients of a filter to be applied to the input signal (such coefficients referred to as "DPD coefficients") in an attempt to reduce and/or cancel distortions of the input signal caused by the amplifier. In this manner, DPD will try to compensate for the amplifier applying an undesirable nonlinear modification to the signal to be transmitted, by applying a corresponding modification to the input signal to be provided to the amplifier.

Models used in DPD algorithms are typically adaptive models, meaning that they are formed in an iterative process by gradually adjusting the coefficients based on the comparison between the data that comes into the input to the amplifier and the data that comes out from the output of the amplifier. Estimation of DPD coefficients is based on acquisition of finite sequences of input and output data (i.e., input to and output from a PA), commonly referred to as "captures," and formation of a feedback loop in which the model is adapted based on the analysis of the captures. More specifically, conventional DPD algorithms are based on General Memory Polynomial (GMP) models that involve forming a set of polynomial equations commonly referred to as "update equations," and searching for suitable solutions to the equations, in a broad solution space, to update a model of the PA. To that end, DPD algorithms solve an inverse problem, which is the process of calculating, from a set of observations, the casual factors that produced these observations.

Solving inverse problems in the presence of nonlinear effects can be challenging and may be ill-posed. In particular, inventors of the present disclosure realized that GMP-based PA models may have limitations due to signal dynamics and limited memory depth required to store polynomial data, especially in presence of the ever-increasing sampling rates used in state-of-the-art RF systems.

Solid-state devices that can be used in high frequency are of great importance in modern semiconductor technologies. Due, in part, to their large band gap and high mobility, III-N based transistors (i.e., transistors that employ compound semiconductor materials with a first sub-lattice of at least one element from group Ill of the periodic table (e.g., Al, Ga, In) and a second sub-lattice of nitrogen (N) as channel materials), such as GaN based transistors, may be particularly advantageous for high frequency applications. In particular, PAs may be built using GaN transistors.

While GaN transistors have desirable features in terms of cut-off frequency and efficiency, their behavior is complicated by an effect known as charge trapping, where defect sites in the transistor channel trap charge carriers. The density of trapped charges is largely dependent on the gate voltage, where the gate voltage is typically proportional to the signal amplitude. To complicate things further, an opposite effect may simultaneously compete with the effect of charge trapping. Namely, as some charge carriers are trapped by defect sites, other charge carriers are released from the traps, e.g., due to thermal activation. These two effects have vastly different time constants: the defect sites may be filled with trapped charges quickly any time the gate voltage is increased, while the release of trapped charges happens more slowly. The release time constants can be 10's of microseconds and up to milliseconds, with the effect typically being very visible on the time scale of the symbol periods in 4G or 5G data, especially for data that contains bursts.

Various embodiments of the present disclosure provide systems and methods that aim to improve on one or more of the drawbacks described above in providing linear and efficient amplifiers (such as, but not limited to, PAs) for RF systems (such as, but not limited to, wireless RF systems of millimeter-wave/5G technologies). In particular, aspects of the present disclosure provide techniques for modelling hardware operations behaviorally using differentiable building blocks and performing a model architecture search (e.g., differentiable neural architecture search (DNAS)) with dataset collected on a target hardware. While aspects of the present disclosure describe techniques for applying model architecture search to optimize a DPD arrangement for linearizing a power amplifier at an RF transceiver, the techniques disclosed herein are suitable for use in optimizing configurations for any suitable hardware block and/or subsystem.

According to an aspect of the present disclosure, a computer-implemented system may implement a method for performing a model architecture search to optimize a configuration for a target hardware to perform a certain data transformation. The data transformation can include linear and/or nonlinear operations and may generally include operations that changes the representation of a signal from one form to another form. The target hardware may include a pool of processing units that can perform at least arithmetic operations and/or signal selection operations (e.g., multiplexing and/or de-multiplexing). The model architecture search may be performed over a search space including the pool of processing units and associated capabilities, a desired hardware resource constraint, and/or hardware operations associated with the data transformation. The model architecture search may also be performed to achieve a certain desired performance metric associated with the data transformation, for example, to minimize an error metric associated with the data transformation.

As used herein, the pool of processing units may include but not limited to, digital hardware blocks (e.g., digital circuits including combinational logics and gates), general processors, digital signal processors, and/or microprocessors that execute instruction codes (e.g., software and/or firmware), analog circuits, application specific integrated circuits (ASICs), field programmable gate arrays (FPGAs), etc. In general, a processing unit (or simply a hardware block) may be a circuit with defined inputs, outputs, and/or control signals. Further, multiple processing units (e.g., circuit blocks) can be connected in a defined way to form a subsystem to perform a data transformation, for example, including a sequence of transformations. The hardware configuration optimization can be performed at a functional level (e.g., with input-output correspondences) and/or at a subsystem level (e.g., including a sequence of operations).

To perform the model architecture search, the computer-implemented system may receive information associated with the pool of processing units. The received information may include hardware resource constraints, hardware operations, and/or hardware capabilities associated with the pool of processing units. The computer-implemented system may further receive a data set associated with the data transformation operation. The data set may be collected on the target hardware and may include input data, output data, control data, etc. The computer-implemented system may train a parameterized model associated with the data transformation using the received hardware information and the received data set. The training may include updating at least one parameter of the parametrized model associated with configuring at least a subset of the processing units in the pool (to perform the data transformation). The computer-implemented system may output one or more configurations for at least the subset of the processing units in the pool.

In some aspects, the computer-implemented system may further generate the parameterized model, for example, by generating a mapping between each of the processing units in the pool to a different one of a plurality of differentiable functional blocks. That is, there is a one-to-one correspondence between each processing units in the pool and each of the differentiable functional blocks.

In some aspects, the data transformation operation may include a sequence of at least a first data transformation and a second data transformation, and the training may include calculating a first parameter (e.g., a first learnable parameter) associated with the first data transformation and a second parameter (e.g., a second learnable parameter) associated with the second data transformation. In some aspects, the calculating the first parameter associated with the first data transformation and the second parameter associated with the second data transformation may be further based on a backpropagation and a loss function. In some aspects, the first data transformation or the second data transformation in the sequence may be associated with an executable instruction code. In other words, the parameterized model can model hardware operations implemented by digital circuits and/or analog circuits and/or instruction codes (e.g., firmware) executable by a processor.

In certain aspects, the data transformation operation may be associated with a DPD for pre-distorting an input signal to a nonlinear electronic component (e.g., a PA). In one example, the data transformation may correspond to a DPD actuation. In this regard, the first data transformation in the sequence may include selecting, based on the first parameter, memory terms from the input signal. The second data transformation in the sequence may include generating, based on the second parameter, feature parameters associated with a nonlinear characteristic of the nonlinear electronic component using a set of basis functions and the selected memory terms. The sequence associated with the data transformation operation may further include a third data transformation including generating a pre-distorted signal based on the feature parameter. In another example, the data transformation may correspond to a DPD adaptation. In this regard, the first data transformation in the sequence may include selecting, based on the first parameter, memory terms from a feedback signal indicative of an output of the nonlinear electronic component or the input signal. The second data transformation in the sequence may include generating, based on the second parameter, features associated with a nonlinear characteristic of the nonlinear electronic component using a set of basis functions and the selected memory terms. The sequence associated with the data transformation operation may further include a third data transformation including updating coefficients based on the features and a second signal (e.g., corresponding to the pre-distorted signal for an indirect learning DPD or a difference between input signal and the feedback signal for a direct learning DPD).

In some aspects, the computer-implement system may include memory storing instruction and one or more computer processors, where the instructions, when executed by the one or more computer processors, cause the one or more computer processors to perform the model architecture search method for configuring the target hardware. In other aspects, the model architecture search method may be in the form of instructions encoded in a non-transitory computable-readable storage medium that, when executed by one or more computer processors, cause the one or more computer processors to perform the method.

According to a further aspect of the present disclosure, an apparatus may include an input node to receive an input signal and a pool of processing units to perform one or more arithmetic operations and/or one or more signal selection operations (e.g., multiplexing and/or de-multiplexing). Each of the processing units in the pool may be associated with at least one parameterized model (e.g., a NAS model) corresponding to a data transformation (e.g., including linear and/or nonlinear operations). The apparatus may further include a control block to configure and/or select, based on a first parameterized model, at least a first subset of the processing units to process the input signal to generate a first signal. In some aspects, the first parameterized model may be trained offline based on a mapping between each of the processing units in the pool to a different one of a plurality of differentiable building blocks and at least one of an input data set or an output data set collected on a target hardware or a hardware constraint. For example, the training may be based on a NAS over the plurality of differentiable building blocks.

In some aspects, the data transformation may include a sequence of data transformations. For example, the data transformation may include a first data transformation followed by a second data transformation, where the first data transformation transforms the input signal into the first signal and the second data transformation transforms the first signal into a second signal. In some aspects, the sequence of data transformation may be performed by a combination of digital hardware block(s) (e.g., digital circuits) and processor(s) executing instruction codes (e.g., software or firmware). For example, the first subset of the processing units may include digital hardware blocks (e.g., digital circuits) to perform the first transformation, and the control block may further configure a second subset of the processing units in the pool to execute instruction codes to perform the second transformation.

In certain aspects, the apparatus may be a DPD apparatus for pre-distorting an input signal to a nonlinear electronic component (e.g., a PA). For example, the input signal received at the input node may correspond to the input signal for the nonlinear electronic component and the first signal may correspond to a pre-distorted signal. The apparatus may further include a memory to store, based on the first parameterized model and DPD coefficients, one or more lookup tables (LUTs) associated with one or more nonlinear characteristics of the nonlinear electronic component. The apparatus may further include a DPD block including the first subset of the processing units. For DPD actuation, the first subset of the processing units may select first memory terms from the input signal based on the first parameterized model. The first subset of the processing units may further generate the pre-distorted signal based on the one or more LUTs and the selected first memory terms. In some aspects, for DPD adaptation using an indirect learning architecture, the first subset of the processing units may further select, based on the first parameterized model, second memory terms from a feedback signal associated with an output of the nonlinear electronic component. The control block may further configure, based on the first parameterized model, a second subset of the processing units to execute instruction codes to calculate or update the DPD coefficients based on the selected second memory terms, a set of basis functions and the input signal. The instruction codes may also cause the second subset of processing units to update at least one of the one or more LUTs based on the calculated coefficients and the set of basis functions. In other aspects, for DPD adaptation using a direct learning architecture, the control block may further configure, based on the first parameterized model, a second subset of the processing units to execute instruction codes to calculate or update the DPD coefficients based on the selected first memory terms, a set of basis functions, and the difference between the input signal and the feedback signal and update at least one of the one or more LUTs based on the calculated coefficients and the set of basis functions.

The systems, schemes, and mechanisms described herein advantageously leverage NAS techniques to search for an optimal configuration for configuring a hardware to perform a certain data transformation. The present disclosure may be particularly advantageous for optimizing configuration for hardware that performs complex data transformation such as DPD since using heuristic search in finding an optimal configuration can be complex, time-consuming, thus increasing cost and/or time-to-market for deploying new hardware. Additionally, the present disclosure may be particularly advantageous for optimizing configuration with additional system constraints and/or multiple optimization targets. Further, the model architecture search-based hardware configuration can be particularly advantageous for certain transformation (from input to output) that cannot be easily represented by a mathematical function or a very high order polynomial may otherwise be required.

Example RF Transceivers with DPD Arrangement

FIG. 1A provides a schematic block diagram of an exemplary RF transceiver 100 in which parameterized model-based DPD may be implemented, according to some embodiments of the present disclosure. As shown in FIG. 1A, the RF transceiver 100 may include a DPD circuit 110, a transmitter circuit 120, a PA 130, an antenna 140, and a receiver circuit 150.

The DPD circuit 110 is configured to receive an input signal 102, represented by x, which may be a sequence of digital samples and which may be a vector. In general, as used herein, each of the lower case, bold italics single-letter labels used in the present figures (e.g., labels x, z, y, and y', shown in FIG. 1A), refers to a vector. In some embodiments, the input signal 102 x may include one or more active channels in the frequency domain, but, for simplicity, an input signal with only one channel (i.e., a single frequency range of in-band frequencies) is described. In some embodiments, the input signal x may be a baseband digital signal. The DPD circuit 110 is configured to generate an output signal 104, which may be represented by z, based on the input signal 102 x. The DPD output signal 104 z may be provided further to the transmitter circuit 120. To that end, the DPD circuit 110 may include a DPD actuator 112 and a DPD adaptation circuit 114. In some embodiments, the actuator 112 may be configured to generate the output signal 104 z based on the input signal 102 x and DPD coefficients c, computed by the DPD adaptation circuit 114, as described in greater detail below.

The transmitter circuit 120 may be configured to upconvert the signal 104 z from a baseband signal to a higher frequency signal, such as an RF signal. The RF signal generated by the transmitter 120 may be provided to the PA 130, which may be implemented as a PA array that includes N individual PAs. The PA 130 may be configured to amplify the RF signal generated by the transmitter 120 (thus, the PA 130 may be driven by a drive signal that is based on the output of the DPD circuit 110) and output an amplified RF signal 131, which may be represented by y (e.g., a vector).

In some embodiments, the RF transceiver 100 may be a wireless RF transceiver, in which case it will also include an antenna 140. In context of wireless RF systems, antenna is a device that serves as an interface between radio waves propagating wirelessly through space and electric currents moving in metal conductors used in a transmitter, a receiver, or a transceiver. During transmission, a transmitter circuit of an RF transceiver may supply an electric signal, which signal is amplified by a PA, and an amplified version of the signal is provided to antenna's terminals. The antenna may then radiate the energy from the signal output by the PA as radio waves. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased antenna arrays generally refer to a collection of antenna elements that are used to focus electromagnetic energy in a particular direction, thereby creating a main beam, a process commonly referred to as "beamforming." Phased antenna arrays offer numerous advantages over single antenna systems, such as high gain, ability to perform directional steering, and simultaneous communication. Therefore, phased antenna arrays are being used more frequently in a myriad of different applications, such as mobile/cellular wireless technology, military applications, airplane radar, automotive radar, industrial radar, and Wi-Fi technology.

In the embodiments where the RF transceiver 100 is a wireless RF transceiver, the amplified RF signal 131 y can be provided to the antenna 140, which may be implemented as an antenna array that includes a plurality of antenna elements, e.g., N antenna elements. The antenna 140 is configured to wirelessly transmit the amplified RF signal 131 y.

In the embodiments where the RF transceiver 100 is a wireless RF transceiver of a phased antenna array system, the RF transceiver 100 may further include a beamformer arrangement, configured to vary the input signals provided to the individual PAs of the PA array 130 to steer the beam generated by the antenna array 140. Such a beamformer arrangement is not specifically shown in FIG. 1 because it may be implemented in different manners, e.g., as an analog beamformer (i.e., where the input signals to be amplifier by the PA array 130 are modified in the analog domain, i.e., after these signals have been converted from the digital domain to the analog domain), as a digital beamformer (i.e., where the input signals to be amplifier by the PA array 130 are modified in the digital domain, i.e., before these signals are converted from the digital domain to the analog domain), or as a hybrid beamformer (i.e., where the input signals to be amplifier by the PA array 130 are modified partially in the digital domain and partially in the analog domain).

Ideally, the amplified RF signal 131 y from the PA 130 should just be an upconverted and amplified version of the output of the transmitter circuit 120, e.g., an upconverted, amplifier, and beamformed version of the input signal 102 x. However, as discussed above, the amplified RF signals 131 y can have distortions outside of the main signal components. Such distortions can result from nonlinearities in the response of the PA 130. As discussed above, it can be desirable to reduce such nonlinearities. Accordingly, the RF transceiver 100 may further include a feedback path (or observation path) that allows the RF transceiver to analyze the amplified RF signal 131 y from the PA 130 (in the transmission path). In some embodiments, the feedback path may be realized as shown in FIG. 1A, where a feedback signal 151 y' may be provided from the PA 130 to the receiver circuit 150. However, in other embodiments, the feedback signal may be a signal from a probe antenna element configured to sense wireless RF signals transmitted by the antenna 140 (not specifically shown in FIG. 1A).

Thus, in various embodiments, at least a portion of the output of the PA 130 or the output of the antenna 140 may be provided, as a feedback signal 151, to the receiver circuit 150. The output of the receiver circuit 150 is coupled to the DPD circuit 110, in particular, to the DPD adaptation circuit 114. In this manner, an output signal 151 (y') of the receiver circuit 150, which is a signal based on the feedback signal 151, which, in turn, is indicative of the output signal 131 (y) from the PA 130, may be provided to the DPD adaptation circuit 114 by way of the receiver circuit 150. The DPD adaptation circuit 114 may process the received signals and update DPD coefficients c applied by the DPD actuator circuit 112 to the input signal 102 x to generate the actuator output 104 z. A signal based on the actuator output z is provided as an input to the PA 130, meaning that the DPD actuator output z may be used to control the operation of the PA 130.

Figure 1C:
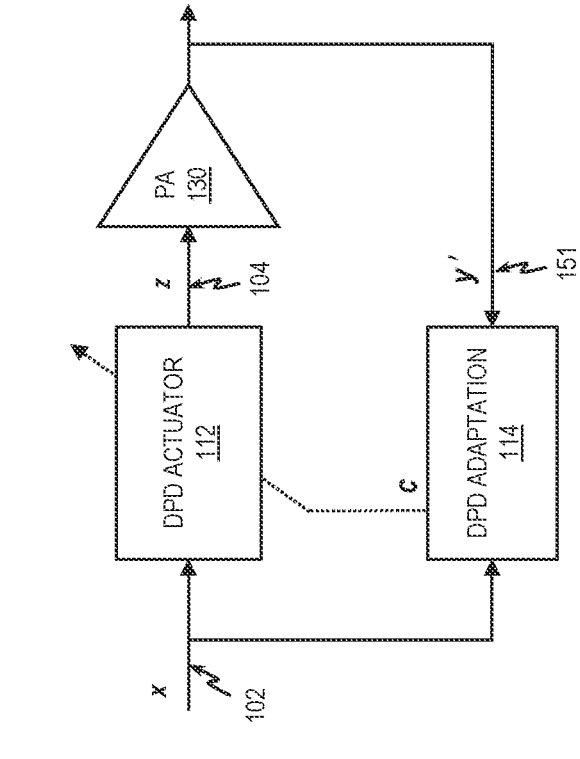
FIG. 1C provides a schematic block diagram of an exemplary direct learning architecture-based DPD in which parameterized model-based configuration may be implemented, according to some embodiments of the present disclosure.
Figure 1B:
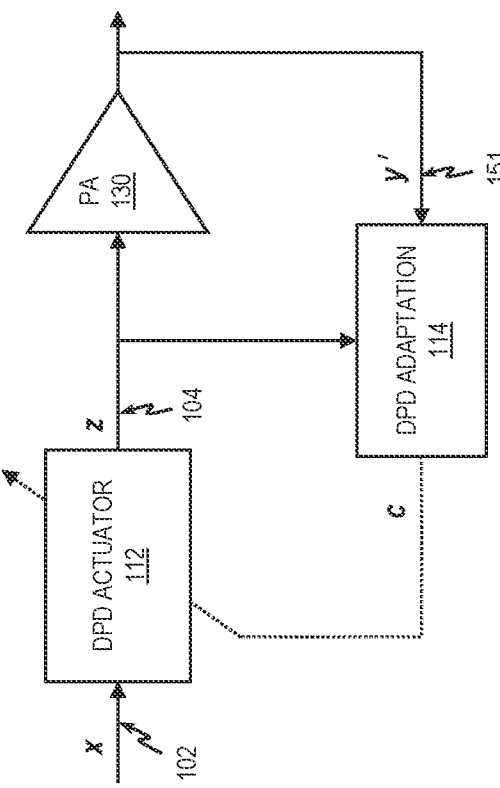
FIG. 1B provides a schematic block diagram of an exemplary indirect learning architecture-based DPD in which parameterized model-based configuration may be implemented, according to some embodiments of the present disclosure.

According to aspects of the present disclosure, the DPD circuit 110 including the DPD actuator circuit 112 and/or the DPD adaptation circuit 114 may be configured based on a parameterized model 170. The parameterized model 170 may be generated and trained offline by a parameterized model training system 172 (e.g., a computer-implemented system such as the data processing system 2300 shown in FIG. 15) using model architecture search techniques (e.g., DNAS) as will be discussed more fully below with reference to FIGS. 2A-2B and 3-14. Further, the DPD actuator circuit 112 and/or the DPD adaptation circuit 114 may be configured to implement DPD using an indirect learning architecture as shown in FIG. 1B or using a direct learning architecture as shown in FIG. 1C.

As further shown in FIG. 1A, in some embodiments, the transmitter circuit 120 may include a digital filter 122, a digital-to-analog converter (DAC) 124, an analog filter 126, and a mixer 128. In such a transmitter, the pre-distorted signal 104 z may be filtered in the digital domain by the digital filter 122 to generate a filtered pre-distorted input, a digital signal. The output of the digital filter 122 may then be converted to an analog signal by the DAC 124. The analog signal generated by the DAC 124 may then be filtered by the analog filter 126. The output of the analog filter 126 may then be upconverted to RF by the mixer 128, which may receive a signal from a local oscillator (LO) 162 to translate the filtered analog signal from the analog filter 126 from baseband to RF. Other methods of implementing the transmitter circuit 120 are also possible and within the scope of the present disclosure. For instance, in another implementation (not illustrated in the present drawings) the output of the digital filter 122 can be directly converted to an RF signal by the DAC 124 (e.g., in a direct RF architecture). In such an implementation, the RF signal provided by the DAC 124 can then be filtered by the analog filter 126. Since the DAC 124 would directly synthesize the RF signal in this implementation, the mixer 128 and the local oscillator 162 illustrated in FIG. 1A can be omitted from the transmitter circuit 120 in such embodiments.

As further shown in FIG. 1A, in some embodiments, the receiver circuit 150 may include a digital filter 152, an analog-to-digital converter (ADC) 154, an analog filter 156, and a mixer 158. In such a receiver, the feedback signal 151 may be downconverted to the baseband by the mixer 158, which may receive a signal from a local oscillator (LO) 160 (which may be the same or different from the local oscillator 160) to translate the feedback signal 151 from the RF to the baseband. The output of the mixer 158 may then be filtered by the analog filter 156. The output of the analog filter 156 may then be converted to a digital signal by the ADC 154. The digital signal generated by the ADC 154 may then be filtered in the digital domain by the digital filter 152 to generate a filtered downconverted feedback signal 151 y', which may be a sequence of digital values indicative of the output y of the PA 130, and which may also be modeled as a vector. The feedback signal 151 y' may be provided to the DPD circuit 110. Other methods of implementing the receiver circuit 150 are also possible and within the scope of the present disclosure. For instance, in another implementation (not illustrated in the present drawings) the RF feedback signal 151 y' can be directly converted to a baseband signal by the ADC 154 (e.g., in a direct RF architecture). In such an implementation, the downconverted signal provided by the ADC 154 can then be filtered by the digital filter 152. Since the ADC 154 would directly synthesize the baseband signal in this implementation, the mixer 158 and the local oscillator 160 illustrated in FIG. 1A can be omitted from the receiver circuit 150 in such embodiments.

Further variations are possible to the RF transceiver 100 described above. For example, while upconversion and downconversion is described with respect to the baseband frequency, in other embodiments of the RF transceiver 100, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 120 or the receiver 150 may include several such stages of IF conversion. In another example, although a single path mixer is shown in each of the transmit (TX) path (i.e., the signal path for the signal to be processed by the transmitter 120) and the receive (RX) path (i.e., the signal path for the signal to be processed by the receiver 150) of the RF transceiver 100, in some embodiments, the TX path mixer 128 and the RX path mixer 158 may be implemented as a quadrature upconverter and downconverter, respectively, in which case each of them would include a first mixer and a second mixer. For example, for the RX path mixer 158, the first RX path mixer may be configured for performing downconversion to generate an in-phase (I) downconverted RX signal by mixing the feedback signal 151 and an in-phase component of the local oscillator signal provided by the local oscillator 160. The second RX path mixer may be configured for performing downconversion to generate a quadrature (Q) downconverted RX signal by mixing the feedback signal 151 and a quadrature component of the local oscillator signal provided by the local oscillator 160 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path. In general, the transmitter circuit 120 and the receiver circuit 150 may utilize a zero-IF architecture, a direct conversion RF architecture, a complex-IF architecture, a high (real) IF architecture, or any suitable RF transmitter and/or receiver architecture.

In general, the RF transceiver 100 may be any device/apparatus or system configured to support transmission and reception of signals in the form of electromagnetic waves in the RF range of approximately 3 kHz to 300 GHz. In some embodiments, the RF transceiver 100 may be used for wireless communications, e.g., in a base station (BS) or a user equipment (UE) device of any suitable cellular wireless communications technology, such as Global System for Mobile Communication (GSM), Code Division Multiple Access (CDMA), or LTE. In a further example, the RF transceiver 100 may be used as, or in, e.g., a BS or a UE device of a millimeter-wave wireless technology such as 5G wireless (i.e., high frequency/short wavelength spectrum, e.g., with frequencies in the range between about 20 and 60 GHz, corresponding to wavelengths in the range between about 5 and 15 millimeters). In yet another example, the RF transceiver 100 may be used for wireless communications using Wi-Fi technology (e.g., a frequency band of 2.4 GHZ, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF transceiver 100 may be used for wireless communications using Bluetooth technology (e.g., a frequency band from about 2.4 to about 2.485 GHz, corresponding to a wavelength of about 12 cm). In other embodiments, the RF transceiver 100 may be used for transmitting and/or receiving wireless RF signals for purposes other than communication, e.g., in an automotive radar system, or in medical applications such as magneto-resonance imaging (MRI). In still other embodiments, the RF transceiver 100 may be used for cable communications, e.g. in cable television networks.

FIG. 1B provides a schematic block diagram of an exemplary indirect learning architecture-based DPD 180 in which a parameterized model-based configuration may be implemented, according to some embodiments of the present disclosure. In some aspects, the DPD circuit 110 of FIG. 1A may be implemented as shown in FIG. 1B, and the parameterized model training system 172 may train the parameterized model 170 to configure the DPD circuit 110 for indirect learning-based adaptation. For simplicity, the transmitter circuit 120 and the receiver circuit 150 are not shown in FIG. 1B and only elements related to performing DPD are shown.

For indirect learning, the DPD adaptation circuit 114 may use the observed received signal (e.g., the feedback signal 151 y') as a reference to predict PA input samples corresponding to the reference. The function used for predicting the input samples is known as an inverse PA model (to linearize the PA 130). Once the prediction of input samples corresponding to the observed data is good (e.g., when the error between the predicted input samples and the pre-distorted signal 104 z satisfies certain criteria), the estimated inverse PA model is used to pre-distort transmit data (e.g., the input signal 102 x) to the PA 130. That is, the DPD adaptation circuit 114 may compute the inverse PA model that is used by the DPD actuator circuit 112 to pre-distort the input signal 102 x. To that end, the DPD adaptation circuit 114 may observe or capture N samples of PA input samples (from the pre-distorted signal 104 z) and N samples of PA output samples (from the feedback signal 151 y'), compute a set of M coefficients, which may be represented by c, corresponding to the inverse PA model, and update the DPD actuation circuit 112 with the coefficients c as shown by the dotted arrow. In some examples, the DPD adaptation circuit 114 may solve for the set of coefficients c using a least square approximation.

FIG. 1C provides a schematic block diagram of an exemplary direct learning architecture-based DPD 190 in which a parameterized model-based configuration may be implemented, according to some embodiments of the present disclosure. In some aspects, the DPD circuit 110 of FIG. 1A may be implemented as shown in FIG. 1C, and the parameterized model training system 172 may train the parameterized model 170 to configure the DPD circuit 110 for direct learning. For simplicity, the transmitter circuit 120 and the receiver circuit 150 are not shown in FIG. 1B and only elements related to performing DPD are shown.

For direct learning, the DPD adaptation circuit 114 may use the input signal 102 x as a reference to minimize the error between the observed received data (e.g., the feedback signal 151 y') and the transmit data (e.g., the input signal 102 x). In some examples, the DPD adaptation circuit 114 may use an iterative technique to compute a set of M coefficients, which may be represented by c, used by the DPD actuator circuit 112 to pre-distort the input signal 102 x. For instance, the DPD adaptation circuit 114 may compute current coefficients based on previously computed coefficients (in a previous iteration) and currently estimated coefficients. The DPD adaptation circuit 114 may compute the coefficients to minimize an error indicative of a difference between the input signal 102 x and the feedback signal 151 y'. The DPD adaptation circuit 114 may update the DPD actuation circuit 112 with the coefficients c as shown by the dotted arrow.

In some aspects, the DPD actuator circuit 112 in the indirect learning-based DPD 180 of FIG. 1B or the direct learning-based DPD 190 of FIG. 1C may implement DPD actuation using a Volterra series or a GMP model (which is a subset of the Volterra series) as shown below:

$$z[n]=\Sigma_{i,j}\Sigma_k c_{ijk} f_k(\|x[n-i]\|)x[n-j], \quad (1)$$

where $z[n]$ represents an $n^{th}$ sample of the pre-distorted signal 104 z, $f_k(\cdot)$ represents a $k^{th}$ function of a DPD model (e.g., include a set of M basis functions), $c_{ijk}$ represents the set of DPD coefficients (e.g., for combining the set of M basis functions), $x[n-i]$ and $x[n-j]$ represent samples of the input signal 102 delayed by i and j number of samples, respectively, and $\|x[n-i]\|$ represents the envelope or amplitude of the sample $x[n-i]$. In some instances, the values for sample delays i and j may be dependent on the PA 130's nonlinear characteristic(s) of interest for the pre-distortion, and $x[n-i]$ and $x[n-j]$ may be referred to as i,j cross-memory terms. While equation (1) illustrates that the GMP model is applied to the envelope or amplitude of the input signal 102 x, aspects are not limited thereto. In general, the DPD actuator circuit 112 may apply DPD actuation to the input signal 102 x directly or after pre-processing the input signal 102 x according to a pre-processing function represented by P ( ) which may be an amplitude function, an amplitude-squared, or any suitable function.

In some aspects, the DPD actuation circuit 112 may implement equation (1) using one or more lookup tables (LUTs). For example, the terms $\Sigma_k c_{ijk} f_k(\|x[n-i]\|)$ may be stored in a LUT, where the LUT for the i,j cross-memory terms may be represented by:

$$L_{i,j}(\|x[n-i]\|)=\Sigma_k c_{ijk} f_k(\|x[n-i]\|). \quad (2)$$

Accordingly, the operations of the DPD actuation circuit 112 may include selecting first memory terms (e.g., $x[n-i]$ and $x[n-j]$) from an input signal 102 x and generating a pre-distorted signal 104 z based on the LUT and the selected first memory terms as will be discussed more fully below with reference to FIGS. 3-5. For DPD adaptation using the direct learning architecture shown in FIG. 1C, the operations of the DPD adaptation circuit 114 may include calculating DPD coefficients (e.g., a set of coefficients $c_k$) based on the selected first memory terms and the set of basis functions $f_k$ and updating the one or more LUTs based on the calculated coefficients. On the other hand, for DPD adaptation using the indirect learning architecture shown in FIG. 1B, the operations of the DPD adaptation circuit 114 may include selecting second memory terms (e.g., $y'[n-i]$ and $y'[n-j]$) from a feedback signal 151 y', calculating DPD coefficients (e.g., a set of coefficients $c_k$) based on the selected second memory terms and the set of basis functions $f_k$ and updating the one or more LUTs based on the calculated coefficients. As such, the DPD circuit 110 may include various circuits such as memory to store LUTs for various cross-memory terms, multiplexers for memory term selections, multipliers, adders, and various other digital circuits and/or processor(s) for executing instructions to perform DPD operations (e.g., actuation and adaptation).

According to aspects of the present disclosure, the parameterized model training system 172 may train the parameterized model 170 to configure the DPD actuation circuit 112 and/or the DPD adaptation circuit 114 to perform these DPD actuation and adaptation (indirect and/or direct learning) operations. Mechanisms for training the parameterized model 170 (e.g., during offline) and configuring a DPD hardware for actuation and adaptation (e.g., during online) according to the trained parameterized model 170 will be discussed more fully below with reference to FIGS. 2A-2B, and 3-14. For simplicity, FIGS. 2A-2B and 3-14 are discussed using the same signal representations as in FIGS. 1A-1C. For example, the symbol x may refer to an input signal to a DPD actuator circuit that linearizes a PA, the symbol z may refer to an output signal (pre-distorted signal) provided by a DPD, the symbol y may refer to an output of the PA, the symbol y' may refer to an observed received signal indicative of an output of the PA, and the symbol c may refer to DPD coefficients for combining basis functions associated with features or nonlinearities of a PA. Further, the input signal 102 x and the pre-distorted signal 104 z can be referred to as transmission data (TX), and the feedback signal 151 y' can be referred to as observation data (ORx).

Example Model Architecture Search for Hardware

An aspect of the present disclosure provides DPD arrangements configured to use NNs and deep-learning algorithms (e.g., DNAS) to discover the optimal kernel that can be mapped to DPD hardware blocks. Such DPD arrangements may be particularly suitable for LUT-based DPD actuators designed for GMP models (e.g., as shown in equation (1)). In some embodiments, the LUT-based DPD actuator may include multiplexers which choose one signal among a pluralities of input signals (e.g., for memory selections). In some embodiments, the LUT-based DPD actuator may include LUTs (e.g., as shown in equation (2)) that are configured to take one signal as input and generate outputs according to the input as will be discussed more fully below with reference to FIGS. 3-6.

In contrast to conventional NAS in which optimization is performed over a differentiable super-set of candidate neural network architectures to select one neural network architecture for the problem at hand using back propagation and a gradient descent search, aspects of the present disclosure model hardware operations behaviorally using differentiable building blocks and performing DNAS with dataset collected on the target hardware. A hardware can be a circuit with defined input-output and control signals or a subsystem with multiple circuit blocks connected in a defined way. Optimization can be performed not only at a functional level (i.e., input-output correspondences) but also on the sequence of operations carried in a subsystem. In an embodiment, the implementation for using DNAS may include the DPD actuator, the transmit signal path, and the DPD adaptation engine running on a microprocessor.

Figure 2A:
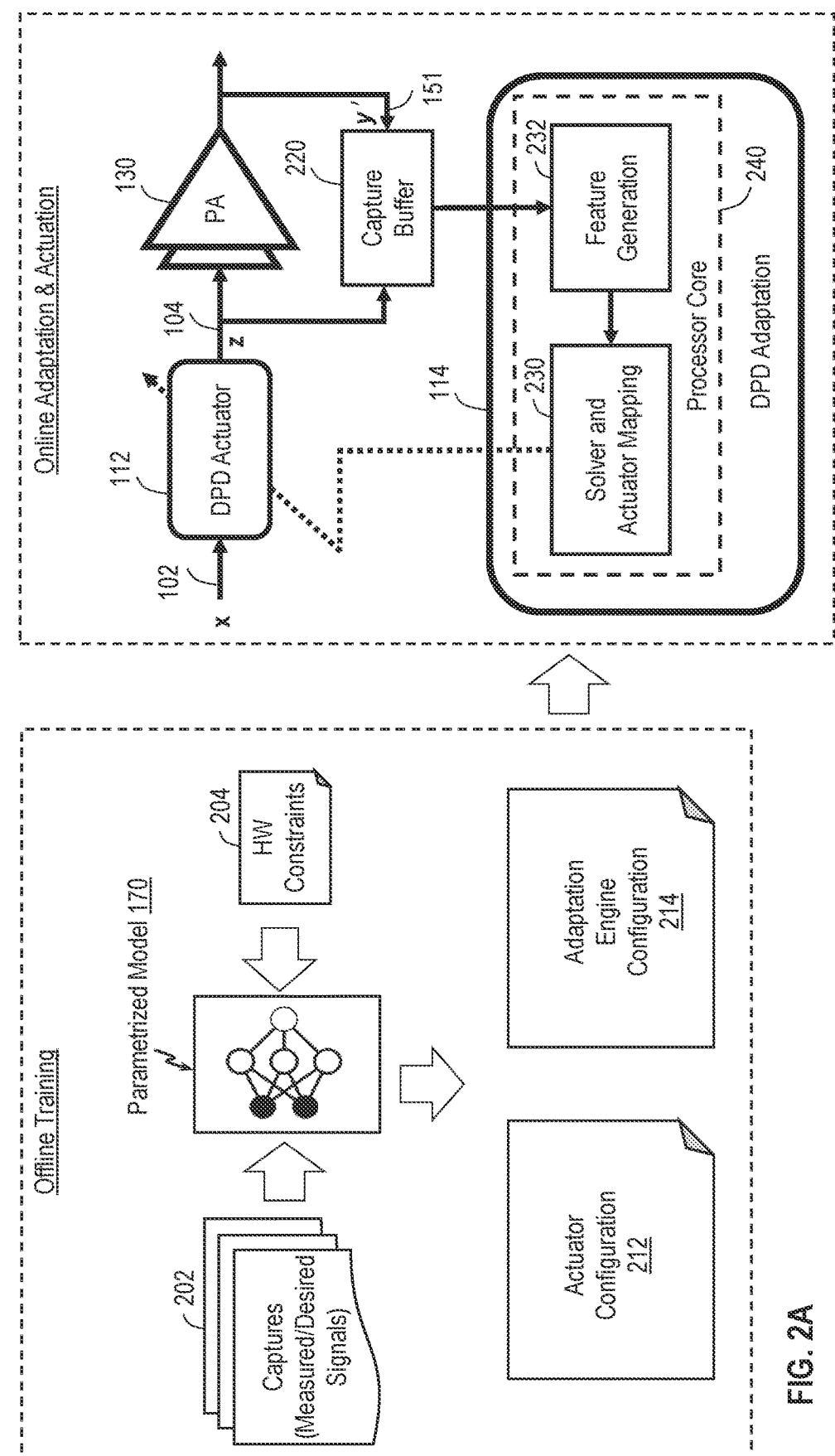
FIG. 2A provides an illustration of a scheme for offline training and online adaptation and actuation for an indirect learning architecture-based DPD, according to some embodiments of the present disclosure.
Figure 2B:
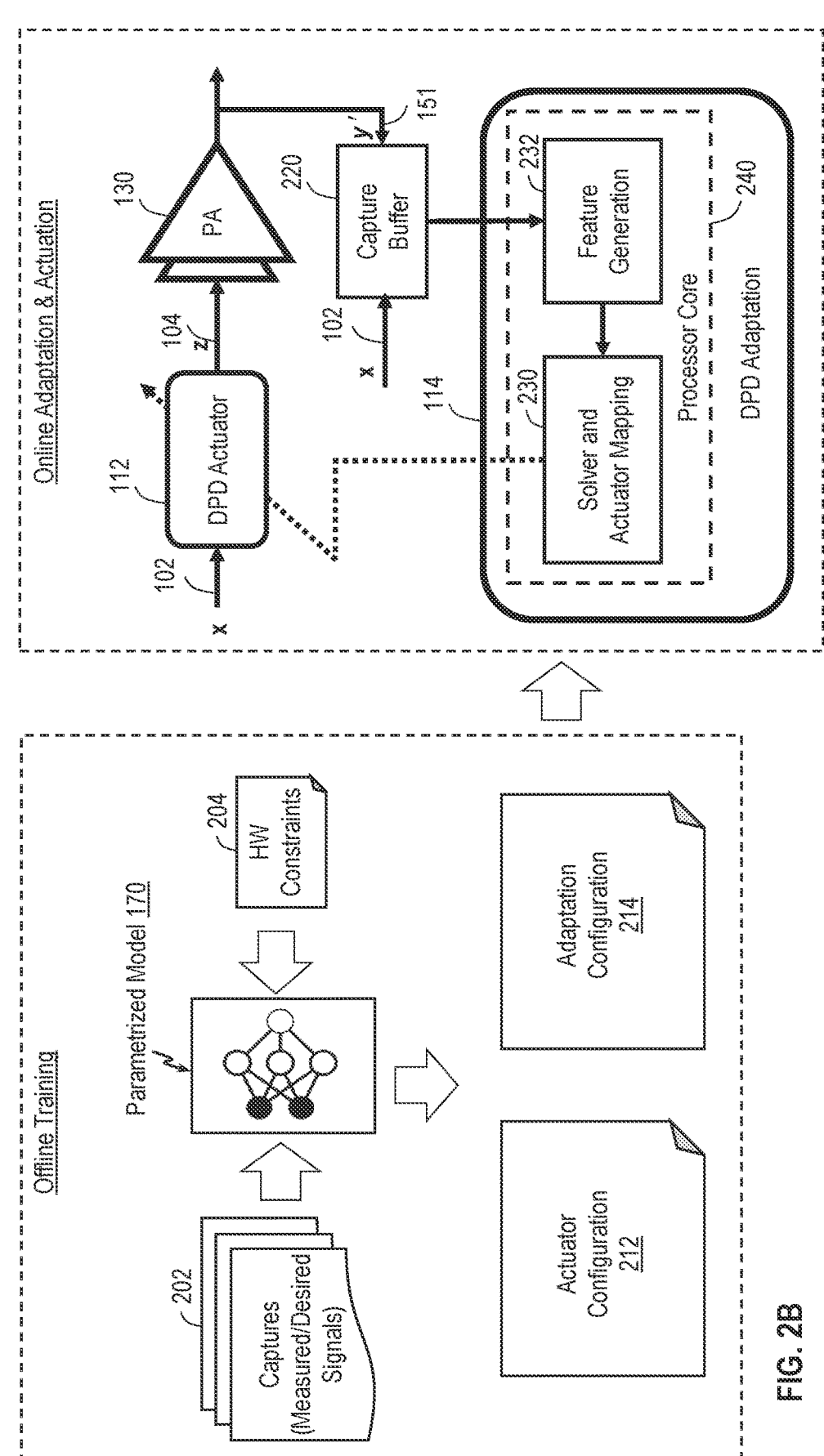
FIG. 2B provides an illustration of offline training and online adaptation and actuation for a direct learning architecture-based DPD, according to some embodiments of the present disclosure.

FIGS. 2A and 2B are discussed in relation to FIG. 1A-1C to illustrate model architecture search mechanisms applied to DPD hardware. FIG. 2A provides an illustration of a scheme 200 for offline training and online adaptation and actuation for an indirect learning architecture-based DPD (e.g. the DPD 180), according to some embodiments of the present disclosure. The scheme 200 includes an offline training shown on the left side of FIG. 2A and an online adaptation and actuation DPD on the right side of FIG. 2A.

In some embodiments, an offline training system (e.g., the parameterized model training system 172) may include a transceiver system, a processor and memory system. The transceiver system may be substantially similar to a target system in which the DPD actuation and adaptation are to be implemented. For instance, the transceiver system may include a PA (e.g., the PA 130), a transmission path (in which an input signal 102 x may be pre-distorted by a DPD actuator circuit 112 and transmitted via the PA 130), and an observation path (in which a feedback signal 151 y' indicative of an output of the PA 130 may be received) substantially similar to the RF transceiver 100 of FIG. 1A.

Figure 15:
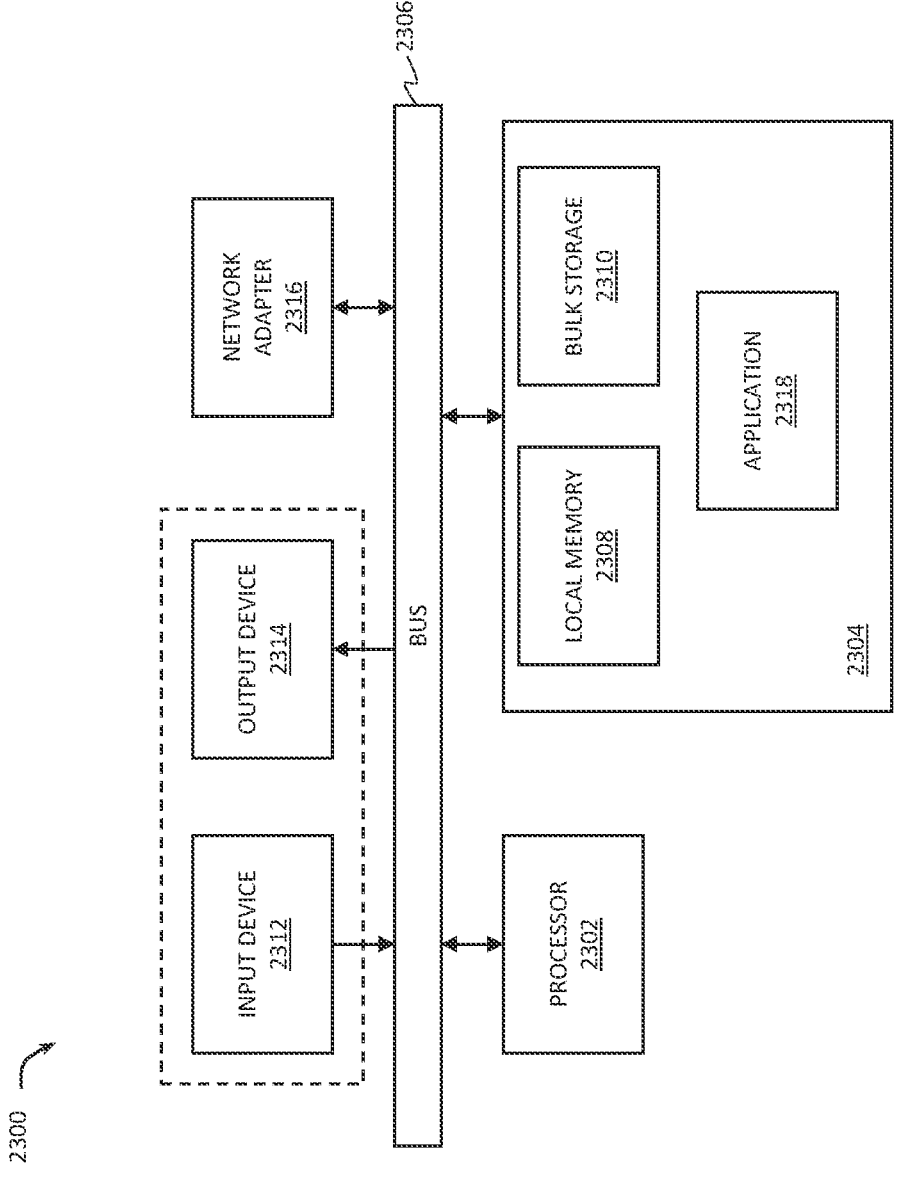
FIG. 15 provides a block diagram illustrating an exemplary data processing system that may be configured to implement, or control, at least portions of performing hardware block configuration using neural networks, according to some embodiments of the present disclosure.

The processor and memory system (e.g., a computer-implemented system such as the data processing system 2300 shown in FIG. 15) may be configured to perform a plurality of captures of the transceiver system's transmission and observation data shown as captures 202 including measured and/or signals. In particular, for indirect learning DPD, the captures 202 may include the pre-distorted signal 104 z and the feedback signal 151 y' captured from the target hardware and/or desired pre-distorted signals and/or feedback signals for corresponding input signals. More specifically, the captures may be performed at certain intervals (e.g., at every 0.5 sec, 1 sec, 2 secs or more), each capture may include L samples of the input signal 102 x, M consecutive samples of the pre-distorted signal 104 z, and/or N samples of the feedback signal 151 y', where L, M, N may be the same or different.

The processor and memory system may generate a parameterized model 170 with a 1-to-1 mapping to the hardware blocks or circuits at the actuator circuit 112 and the DPD adaptation circuit 114. The processor and memory system may generate the parameterized model 170 further based on hardware constraints 204 (e.g., target resource utilization or power consumption) associated with the actuator circuit 112 and the DPD adaptation circuit 114. The processor and memory system may further perform an optimization algorithm that takes the transmission and observation captures 202 and optimize actuator model parameters and adaptation model parameters for the parameterized model 170.

After completing the optimization, the processor and memory system may convert the optimized parameterized model 170 (with optimized parameters) to configurations, for example, an actuator configuration 212 and an adaptation engine configuration 214, that can be loaded onto a firmware for configuring a corresponding hardware for online operations. In some examples, the parameterized model 170 may be trained for a certain type of PA 130 having certain nonlinear characteristics, and thus the actuator configuration 212 and the adaptation engine configuration 214 may include parameters for configuring a DPD actuator and a DPD adaptation engine, respectively, to pre-compensate for those nonlinear characteristics. In some examples, the actuator configuration 212 may indicate information for configuring LUTs for DPD actuation and the adaptation engine configuration 214 may indicate information associated with basis functions to be used for adapting coefficients used by the DPD actuator.

In some embodiments, an on-chip DPD sub-system for actuation and adaptation may include a DPD actuator circuit 112, a PA 130, a transmission path (in which an input signal 102 x may be pre-distorted by a DPD actuator circuit 112 and transmitted via the PA 130), an observation path (in which a feedback signal 151 y' indicative of an output of the PA 130 may be received), a capture buffer 220, and a processor and memory system (e.g., including the processor core 240) as shown on the right side of FIG. 2A. The DPD actuator 112 may include LUTs (e.g., equation (2)) and memory-term programmable delays and multiplexers. The processor and memory system may be configured to configure DPD actuator 112's memory-term programmable delays and multiplexers according to offline trained parameters (e.g., indicated by the actuator configuration 212). The processor and memory system may perform memory term selection and basis function generation (shown by the feature generation 232 at the DPD adaptation circuit 114) according to offline trained parameters (e.g., indicated by the adaptation engine configuration 214) and the data in the capture buffer 220. In particular, for indirect learning DPD, the processor and memory system may capture the pre-distorted signal 104 z output by the DPD actuator circuit 112 and the feedback signal 151 y' at the capture buffer 220. The processor and memory system may further use selected memory terms and generated basis functions to solve for a set of linear combination coefficients (shown by the solver and actuator mapping 230 at the DPD adaptation circuit 114). In some examples, the solver and actuator mapping 230 may utilize least square approximation techniques may be used to solve to the set of linear combination coefficients. The processor and memory system may further generate LUT entries from the solved coefficients and the basis functions according to offline trained parameters (e.g., indicated by the adaptation engine configuration 214) and map to corresponding memory term LUTs. Further, in some aspects, the DPD actuator circuit 112 may be implemented by digital hardware blocks or circuits, and the DPD adaptation circuit 114 may be implemented by the processor core 240 executing instruction codes (e.g., a firmware) that performs the feature generation 232 and the solver and actuator mapping 230.

FIG. 2B provides an illustration of a scheme 250 for offline training and online DPD adaptation and actuation for a direct learning architecture-based DPD (e.g., the DPD 190), according to some embodiments of the present disclosure. The scheme 250 of FIG. 2B is similar to the scheme 200 of FIG. 2A in many respects; for brevity, a discussion of these elements is not repeated, and these elements may take the form of any of the embodiments disclosed herein.

As mentioned above with reference to FIG. 1C, for a direct learning DPD, the DPD adaptation circuit 114 may compute the coefficients to minimize an error indicative of a difference between the input signal 102 x and the feedback signal 151 y'. Accordingly, in the scheme 250, for offline training on the left side of FIG. 2B, the offline processor and memory system (e.g., a computer-implemented system such as the data processing system 2300 shown in FIG. 15) may perform a plurality of captures of the input signal 102 x and the feedback signal 151 y' from the target hardware. That is, the captures 202 may include input signal 102 x and the feedback signal 151 y' collected from the target hardware and/or desired feedback signals for corresponding input signals. Further, as shown in the right side of FIG. 2B, the on-chip DPD sub-system for actuation and adaptation may capture the input signal 102 x and the feedback signal 151 y' at the capture buffer 220. The feature generation 232 may be based on the input signal 102 x and the feedback signal 151 y'. Further, in some examples, the solver and actuator mapping 230 may solve for set of linear combination coefficients used by the DPD actuator circuit 112 using an iterative solution approach.

Example Offline Parameterized Model Training for a Target Hardware Using Model Architecture Search Techniques Accordingly, in certain aspects, a computer-implemented system (e.g., the parameterized model training system 172 of FIG. 1A and/or the data processing system 2300 of FIG. 15) may implement an offline training method for performing a model architecture search to optimize a hardware configuration for a target hardware to perform a certain data transformation (e.g., DPD actuation and/or adaptation) as shown in the offline training of FIGS. 2A and 2B. The data transformation can include linear and/or nonlinear operations. The target hardware (e.g., the on-chip DPD subsystem shown on the right side of FIG. 2A) may include a pool of processing units that can perform at least arithmetic operations and/or signal selection operations (e.g., multiplexing and/or de-multiplexing). The model architecture search may be performed over a search space including the pool of processing units and associated capabilities, a desired hardware resource constraint (e.g., HW constraints 204), and/or hardware operations associated with the data transformation. The model architecture search may also be performed to achieve a certain desired performance metric associated with the data transformation, for example, to minimize an error metric associated with the data transformation.

To perform the model architecture search, the computer-implemented system may receive information associated with the pool of processing units. The received information may include hardware resource constraints (e.g., the HW constraints 204), hardware operations (e.g., signal selections, multiplication, addition, address generation for table lookup, etc.), and/or hardware capabilities (e.g., speed, delays, etc.) associated with the pool of processing units. The computer-implemented system may further receive a data set (e.g., the captures 202) associated with the data transformation operation. The data set may be collected on the target hardware and may include input data, output data, control data, etc. That is, the data set may include signals measured from the target hardware and/or desired signals. In some examples, the data set may include captures of the input signal 102 x, the pre-distorted signal 104 z, and/or the feedback signal 151 y', for example, depending on whether a direct learning DPD architecture or an indirect learning DPD architecture is used. The computer-implemented system may train a parameterized model (e.g., the parameterized model 170) associated with the data transformation using the received hardware information and the received data set. The training may include updating at least one parameter of the parametrized model associated with configuring at least a subset of the processing units in the pool (to perform the data transformation). The computer-implemented system may output one or more configurations (e.g., the actuator configuration 212 and the adaptation engine configuration 214) for at least the subset of the processing units in the pool.

In some aspects, the computer-implemented system may further generate the parameterized model, for example, by generating a mapping between each of the processing units in the pool to a different one of a plurality of differentiable functional blocks. That is, there is a one-to-one correspondence between each processing units in the pool and each of the differentiable functional blocks.

In some aspects, the data transformation operation may include a sequence of at least a first data transformation and a second data transformation, and the training may include calculating a first parameter (e.g., a first learnable parameter) associated with the first data transformation and a second parameter (e.g., a second learnable parameter) associated with the second data transformation. In some aspects, the calculating the first parameter associated with the first data transformation and the second parameter associated with the second data transformation may be further based on a backpropagation and a loss function (e.g., by using a gradient descent search). In some aspects, the first data transformation or the second data transformation in the sequence may be associated with an executable instruction code. In other words, the parameterized model can model hardware operations implemented by digital circuits and/or analog circuits and/or instruction codes (e.g., firmware) executable by a processor.

In an example of modelling DPD actuation for offline training, the first data transformation in the sequence may include selecting, based on the first parameter, memory terms from the input signal (e.g., the input signal 102 x). The second data transformation in the sequence may include generating, based on the second parameter, feature parameters associated with a nonlinear characteristic of the PA 130 using a set of basis functions (e.g., $f_k(\cdot)$) and the selected memory terms. The sequence associated with the data transformation operation may further include a third data transformation including generating a pre-distorted signal (e.g., the pre-distorted signal 104 z) based on the feature parameter.

In an example of modeling DPD adaptation for offline training, the first data transformation in the sequence may include selecting, based on the first parameter, memory terms from a feedback signal (e.g., the feedback signal 151 y') indicative of an output of the nonlinear electronic component or the input signal. The second data transformation in the sequence may include generating, based on the second parameter, features associated with a nonlinear characteristic of the PA 130 using a set of basis functions (e.g., $f_k$), DPD coefficients (e.g., $c_k$) and the selected memory terms. The sequence associated with the data transformation operation may further include a third data transformation including updating coefficients based on the features and a second signal. The second signal may correspond to the pre-distorted signal 104 z when using an indirect learning DPD (e.g., as shown in FIG. 1B). Alternatively, the second signal may correspond to a difference between input signal 102 x and the feedback signal 151 y' when using a direct learning DPD (e.g., as shown in FIG. 1C).

Figure 16:
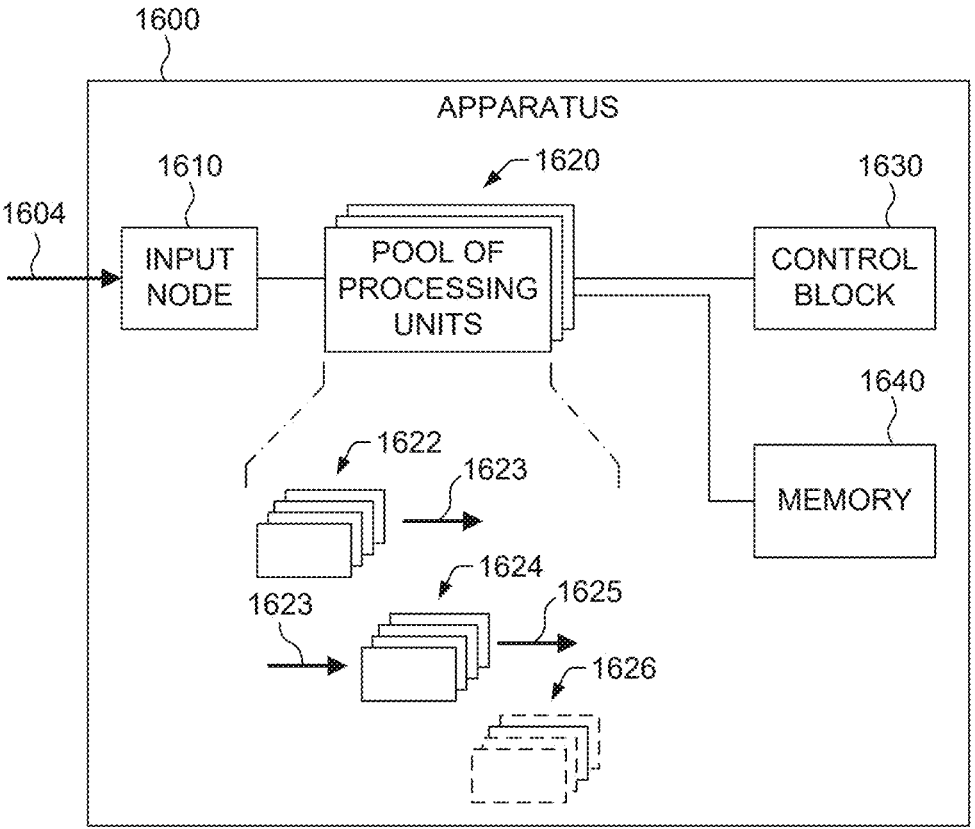
FIG. 16 provides a block diagram of an example of an apparatus according to some embodiments of the present disclosure.

Example Online Hardware Operations Based on a Parameterized Model Trained Using Model Architecture Search Techniques In certain aspects, an apparatus 1600 (FIG. 16) may be configured based on a parameterized model (e.g., the parameterized model 170) trained as discussed herein for online operations. For example, the apparatus 1600 may include an input node 1610 to receive an input signal 1604 and a pool of processing units 1620 to perform one or more arithmetic operations (e.g., multiplications, additions, etc.) and/or one or more signal selection operations (e.g., multiplexing and/or de-multiplexing, address generations, etc.). Each of the processing units in the pool of processing units 1600 may be associated with at least one parameterized model (e.g., a NAS model) corresponding to a data transformation (e.g., including linear operations, nonlinear operations, DPD operations, etc.). The apparatus 1600 may further include a control block 1630 (e.g., control registers) to configure and/or select, based on a first parameterized model (e.g., the parameterized model 170), at least a first subset 1622 of the processing units in the pool of processing units 1620 to process the input signal to generate a first signal 1623. In some aspects, the first parameterized model may be trained offline based on a mapping between each of the processing units in the pool to a different one of a plurality of differentiable building blocks and at least one of an input data set or an output data set collected on a target hardware or a hardware constraint (e.g., a target resource utilization and/or power consumption). For example, the training may be based on a NAS over the plurality of differentiable building blocks as discussed herein.

In some aspects, the data transformation may include a sequence of data transformations. For example, the data transformation may include a first data transformation followed by a second data transformation, where the first data transformation transforms the input signal 1604 into the first signal 1623 and the second data transformation transforms the first signal 1623 into a second signal 1625. In some aspects, the sequence of data transformation may be performed by a combination of digital hardware block(s) (e.g., digital circuits) and processor(s) executing instruction codes (e.g., software or firmware). For example, the first subset 1622 of the processing units may include digital hardware blocks (e.g., digital circuits) to perform the first transformation, and the control block 1630 may further configure a second subset 1624 of the processing units in the pool of processing units 1620 to execute instruction codes to perform the second transformation.

In certain aspects, the apparatus 1600 may be a DPD apparatus (e.g., DPD circuit 110) for pre-distorting an input signal to a nonlinear electronic component. For example, the received input signal 1604 may correspond to the input signal 102 x, the nonlinear electronic component may correspond to the PA 130, and the first signal 1623 may correspond to the pre-distorted signal 104 z. The apparatus 1600 may further include a memory 1640 to store, based on the first parameterized model, one or more lookup tables (LUTs) associated with one or more nonlinear characteristics of the nonlinear electronic component. The apparatus 1600 may further include a DPD block including the first subset 1622 of the processing units to select first memory terms (e.g., the [n−i] and x[n−j] terms shown in equation (1)) from the input signal 1604 based on the first parameterized model. The first subset 1622 of the processing units may further generate the pre-distorted signal based on the one or more LUTs (e.g., $L_{i,j}$ shown in equation (2)) and the selected first memory terms (e.g., for DPD actuation). In some aspects, the first subset 1622 of the processing units may further select, based on the first parameterized model, second memory terms (e.g., y'[n−i] and y'[n−j]) from a feedback signal (e.g., feedback signal 151 y') associated with an output of the nonlinear electronic component. The control block 1630 may further configure, based on the first parameterized model, a second subset 1624 of the processing units to execute instruction codes to calculate, based on the selected second memory terms and a set of basis functions, DPD coefficients (e.g., the set of coefficients $c_k$) and update, based on the calculated coefficients and the set of basis functions, at least one of the one or more LUTs (e.g., for DPD adaptation).

Example LUT-Based DPD Actuator Implementations

As discussed above, in some embodiments, the LUT-based DPD actuator may include multiplexers which choose one signal among a pluralities of input signals. In some embodiments, the LUT-based DPD actuator contains LUTs that are configured to take one signal as input and generate outputs according to the input. FIGS. 3-5 illustrate various implementations for LUT-based DPD actuators.

Figure 3:
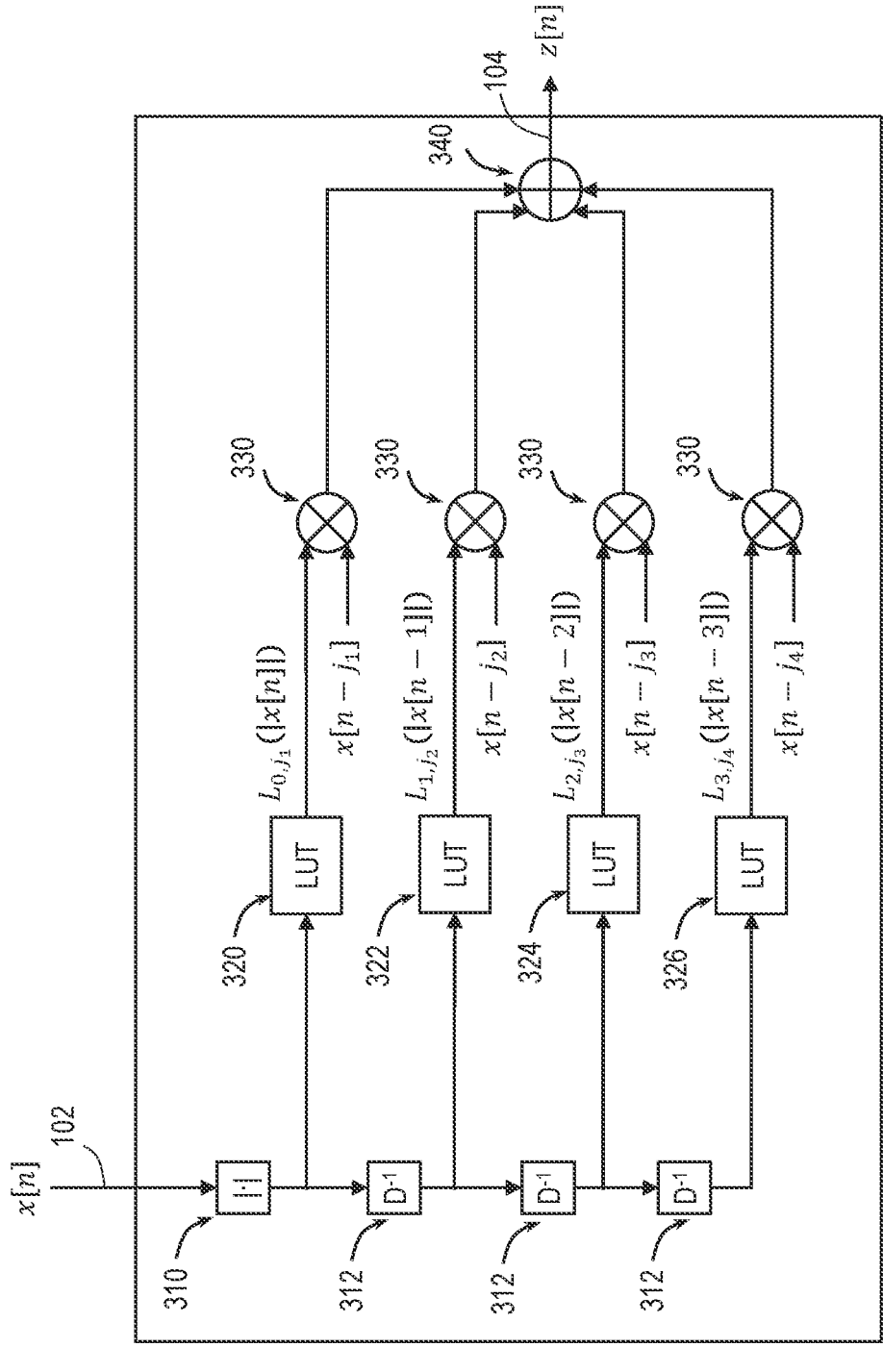
FIG. 3 provides an illustration of an exemplary implementation for a lookup table (LUT)-based DPD actuator circuit, according to some embodiments of the present disclosure.

FIG. 3 provides an illustration of an exemplary implementation for a LUT-based DPD actuator circuit 300, according to some embodiments of the present disclosure. For instance, the DPD actuator circuit 112 of FIG. 1A-1C, 2A-2B may be implemented as shown in FIG. 3. As shown in FIG. 3, the LUT-based DPD actuator circuit 300 may include a complex to magnitude conversion circuit 310, a tapped delay line 312, a plurality of LUTs 320, 322, 324, 326, complex multipliers 330, and an adder 340. For simplicity, FIG. 3 illustrates three delay taps 312. However, the LUT-based DPD actuator circuit 300 may be scaled to include any suitable number of delay taps 312 (e.g., 1, 2, 3, 4, 5, 10, 100, 200, 500, 1000 or more).

The LUT-based DPD actuator circuit 300 may receive an input signal 102 x, for example, including a block of samples x[n], where N may vary from 0 to (N−1) and may be represented as $x_0, x_1, \ldots, x_{N-1}$. In some instances, the input signal 102 x may be a digital baseband complex in-phase, quadrature-phase (IQ) signal. The complex to magnitude conversion circuit 310 may compute an absolute value or magnitude for each complex sample x[n]. The tapped delay line 312 may generate a delayed version of the magnitudes of the input signal 102 x, for example, $|x_0|, |x_1|, \ldots, |x_{N-1}|$. The LUT 320 (e.g., the LUT for $L_{0,j_1}$) may take the magnitude of the signal |x[n]| as inputs and generate outputs $L_{0,j_1}(|x[n]|)$. In a similar way, the LUT 322 (e.g., the LUT for $L_{1,j_2}$) may take the magnitude of the signal |x[n−1]| as inputs and generate outputs $L_{1,j_2}(|x[n−j2]|)$, the LUT 324 (e.g., the LUT for $L_{2,j_3}$) may take the magnitude of the signal |x[n−2]| as inputs and generate outputs $L_{2,j_3}(|x[n−j3]|)$, and the LUT 326 (e.g., the LUT for $L_{3,j_4}$) may take the magnitude of the signal |x[n−3]| as inputs and generate outputs $L_{3,j_4}(|x[n−j4]|)$. The outputs of the LUTs 320, 322, 324, 326 are then multiplied with x[n−j1], x[n−j2], x[n−j3], and x[n−j4], respectively, at the complex multipliers 330. The products from the outputs of the complex multipliers 330 are summed at the adder 340 to provide an output, z[n], for the actuator 300, where the output may correspond to the pre-distorted signal 104 z.

While FIG. 3 illustrates the LUTs 320, 322, 324, 326 as separate LUTs, each corresponding to a certain i,j cross-memory terms (e.g., modeling certain nonlinear character-istic(s) of the PA 130), in general, the LUT-based DPD actuator circuit 400 may store the LUTs 320, 322, 324, 326 in any suitable forms.

Figure 4:
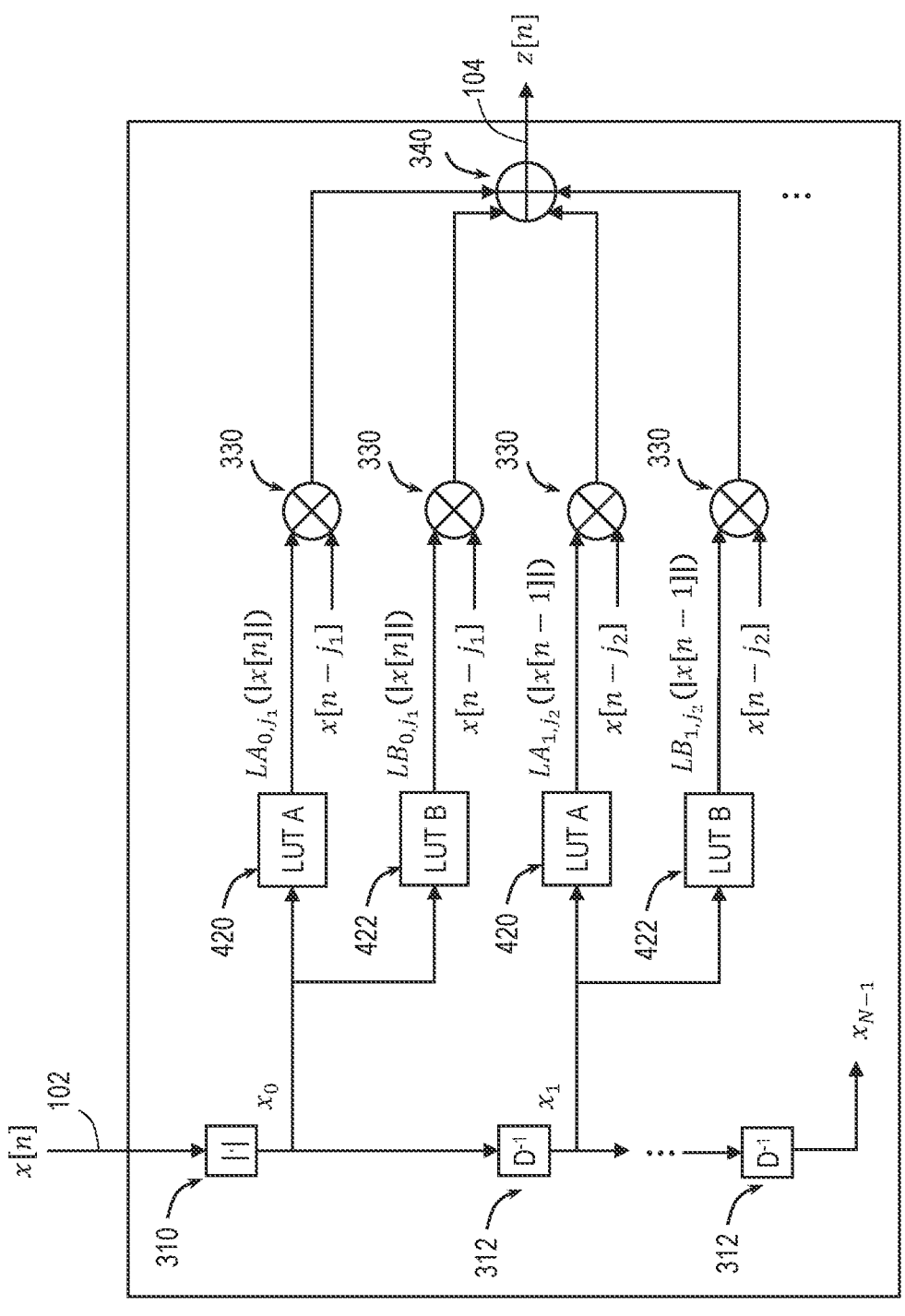
FIG. 4 provides an illustration of an exemplary implementation for a LUT-based DPD actuator circuit, according to some embodiments of the present disclosure.

FIG. 4 provides an illustration of an exemplary imple-mentation for a LUT-based DPD actuator circuit 400, according to some embodiments of the present disclosure. For instance, the DPD actuator circuit 112 of FIG. 1A-1C, 2A-2B may be implemented as shown in FIG. 4. The LUT-based DPD actuator circuit 400 of FIG. 4 is similar to the LUT-based DPD actuator circuit 300 of FIG. 3 in many respects; for brevity, a discussion of these elements is not repeated, and these elements may take the form of any of the embodiments disclosed herein.

In FIG. 4, the LUT-based DPD actuator circuit 400 may utilize multiple LUTs to generate a pre-distorted signal sample z[n] instead of a single LUT for each pre-distorted sample z[n] as in the LUT-based DPD actuator circuit 300 of FIG. 3. For simplicity, FIG. 4 illustrates the LUT-based DPD actuator circuit 400 utilizing two LUTs, a LUT A 420 and a LUT B 422, to generate each pre-distorted sample z[n]. However, the LUT-based DPD actuator circuit 400 may be scaled to use any suitable number of LUTs (e.g., about 3, 4 or more), to generate each pre-distorted sample z[n]. Further, in order not to clutter the drawings of FIG. 4, FIG. 4 only illustrates LUT A 420 and LUT B 422 for the first two samples, $x_0$ and $x_1$, but the LUT A 420 and LUT 422 may be included for each of the delayed sample $x_2$, $x_3$, . . . , $x_{N-1}$.

As shown in FIG. 4, for the sample x[n], the LUT A 420 may take the magnitude of the signal |x[n]| as inputs and generate outputs $LA_{0,j_1}$ (|x[n]|) and the LUT B 422 may take the magnitude of the signal |x[n]| as inputs and generate outputs $LB_{0,j_1}$ (|x[n]|). In a similar way, for the sample x[n−1], the LUT A 420 may take the magnitude of the signal |x[n−1]| as inputs and generate outputs $LA_{1,j_2}$ (|x[n−1]|) and the LUT B 422 may take the magnitude of the signal |x[n−1]| as inputs and generate outputs $LB_{1,j_2}$ (|x[n−1]|), and so on. In some examples, the LUT A 420 and the LUT B 422 may each model a different nonlinear characteristic of the PA 130. The outputs of the LUTs 420 and 422 for each sample x[n], x[n−1], . . . , x[n−N−1] are multiplied with respective memory terms x[n−j1], x[n−j2], . . . , at the complex multipliers 330. The products from the outputs of the complex multipliers 330 are summed at the adder 340 to provide an output, z[n], for the actuator 300, where the output may correspond to the pre-distorted signal 104 z.

While FIG. 4 illustrates the LUTs 420 and 422 as separate LUTs, each corresponding to a certain i,j cross-memory terms, in general, the LUT-based DPD actuator circuit 400 may store the LUTs 420 and 422 in any suitable forms.

Figure 5:
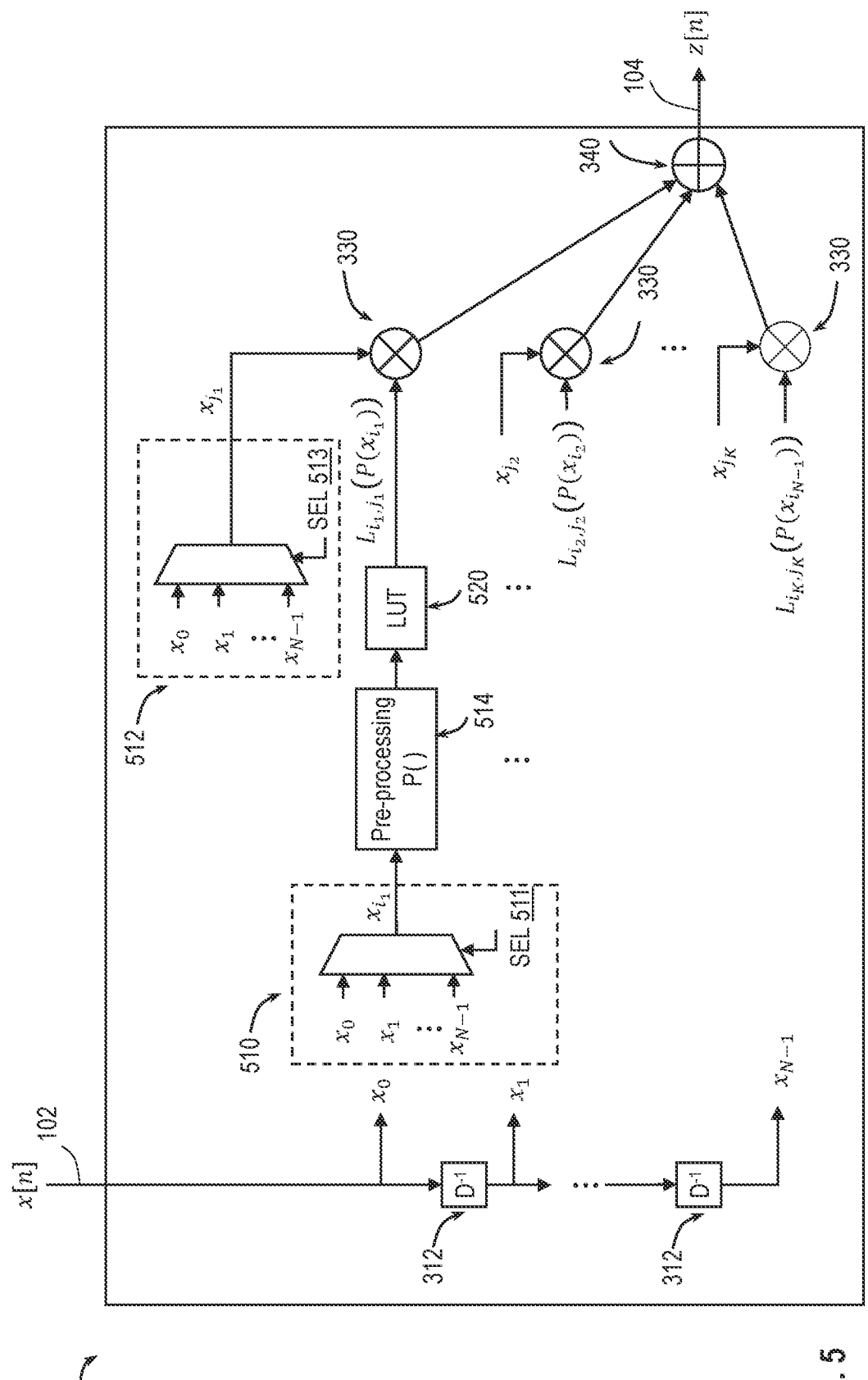
FIG. 5 provides an illustration of an exemplary implementation for a LUT-based DPD actuator circuit, according to some embodiments of the present disclosure FIG. 6 provides an illustration of an exemplary software model derived from a hardware design with a one-to-one functionality mapping, according to some embodiments of the present disclosure.

FIG. 5 provides an illustration of an exemplary imple-mentation for a LUT-based DPD actuator circuit 500, according to some embodiments of the present disclosure. For instance, the DPD actuator circuit 112 of FIG. 1A-1C, 2A-2B may be implemented as shown in FIG. 5. The LUT-based DPD actuator circuit 500 of FIG. 5 is similar to the LUT-based DPD actuator circuit 300 of FIG. 3 in many respects; for brevity, a discussion of these elements is not repeated, and these elements may take the form of any of the embodiments disclosed herein. As shown in FIG. 5, the LUT-based DPD actuator circuit 500 may include a tapped delay line 312, a plurality of signal multiplexer 510, a plurality of pre-processing circuits 514 (e.g., represented by a pre-processing function P(·)), a plurality of LUTs 520, a plurality of signal multiplexers 512, a plurality of multipliers 330, and an adder 340. In order not to clutter the drawings of FIG. 5, FIG. 5 only illustrates a signal multiplexer 510, a pre-processing circuit 514, a LUT 520, and a signal multi-plexer 512 for the first sample, $x_0$, but a signal multiplexer 510, a pre-processing circuit 514, a LUT 520, and a signal multiplexer 512 may be arranged for each of the delayed sample $x_1$, $x_2$, . . . , $x_{N-1}$ in a similar way as for the sample $x_0$.

As shown FIG. 5, the tapped delay line 312 generates delayed version of the input signal 102 x, for example, represented as $x_0$, $x_1$, . . . , $x_{N-1}$. Each multiplexer 510 chooses one signal, $x_i$, among all possible inputs based on a selection signal 511. Each signal multiplexer 512 chooses one signal, $x_j$, among all possible inputs based in a selection signal 513. Each pre-processing circuit 514 pre-processes a respective chosen signal $x_i$. The pre-processing can be a complex envelope or amplitude computation, magnitude-square, a scaling function, or any suitable pre-processing function. Each LUT 520 takes the processed signal $P(x_i)$ as inputs and generate outputs, $L_{i,j}(P(x_i))$. The outputs of the LUTs 520 are then multiplied with the respective signal chosen by the signal multiplexer 512 at the complex mul-tipliers 330. The products from the outputs of the complex multipliers 330 are summed at the adder 340 to provide an output, z[n], for the actuator 300, where the output may correspond to the pre-distorted signal 104 z.

The hardware implementations for LUT-based DPD actuators shown in FIGS. 3-5 may be used to drive a model architecture search for a DPD block. In some aspects, selection signal 511 for the multiplexer 510, the selection signal 513 for the multiplexer 512, and the LUT 520 may be mapped to learnable parameters trained as part of the model architecture search as will be discussed more fully below. Mapping Hardware Blocks to Parameterized Model Ele-ments According to aspects of the present disclosure, a com-puter-implemented system may create a software model of a DPD actuator hardware (e.g., the LUT-based DPD actua-tors shown in FIGS. 3-5) which captures relevant hardware constraints (e.g., allowed memory terms, LUTs, model size, etc.). The software model can include the adaptation step (e.g., a linear-least-squares adaptation in the case of indirect learning DPD or an iterative solution in the case of direct learning DPD) in the model to determine the set of DPD coefficients c (e.g., as shown in equation (1) above). In some embodiments, the nonlinear LUT basis functions (e.g., $f_k(·)$) may be arbitrary (GMP restricts them to be polynomial). For example, a sequence of NN layers may be used. In some embodiments, the memory term multiplexing may be mod-eled using vector dot-product parameterized with weights w.

The nonlinear functions may be co-optimized along with the choice of memory terms in offline pre-training phase and may be used without adaptation (i.e., any means of changing pre-trained parameters) in post-deployment operations.

In some embodiments, "learnable" multiplexing layers may be used to enable optimization of the choice of memory terms. This may be done to perform "N choose M" (M<N) operation with learnable parameters.

In some embodiments, the parameters of the LUT basis functions and the "learnable" multiplexing layers may be trained to minimize a final least square error. For example, in some embodiments, this may be done using gradient descent with backpropagation.

In some examples, the generation of the software model may include replicating hardware operations in specifically designed differentiable building blocks, reproducing a sequence of hardware events as differentiable computational graph, and optimizing a hardware configuration offline with
hardware capabilities and constraints.

Figure 6:
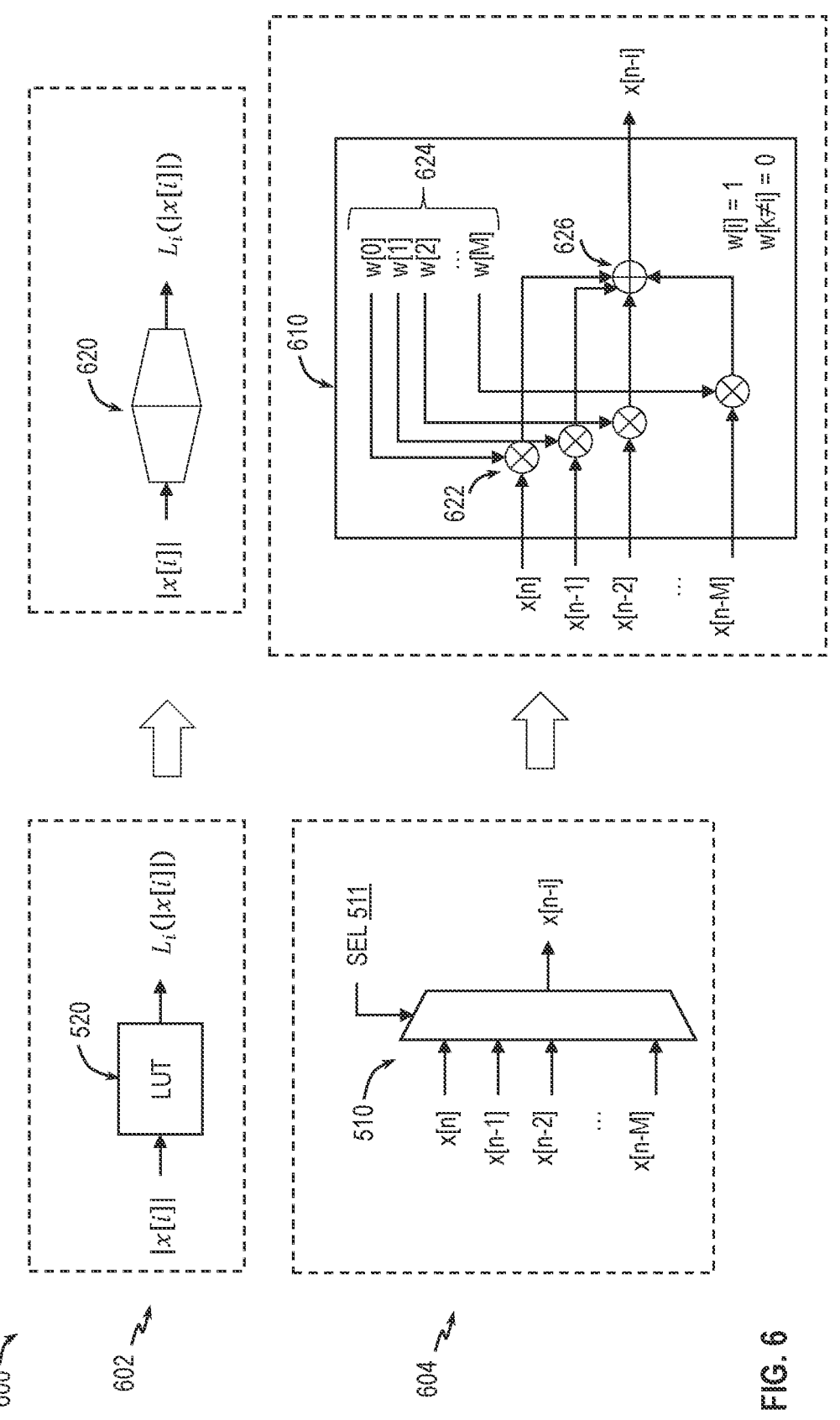

FIG. 6 is discussed in relation to FIG. 5 and may use the
same reference numerals to refer to the same elements as in
FIG. 5 for simplicity's sake. FIG. 6 provides an illustration
of an exemplary software model 600 derived from a hard-
ware design with a one-to-one functionality mapping,
according to some embodiments of the present disclosure.
As shown in FIG. 6, the software model 600 may include a
first part 602 that models LUT operations and a second part
604 that models memory term selection operations.

In the first part 602, the LUT 520 operation one the DPD
hardware may take the magnitude of input signal |x[i]| as an
input and generating an output $L_i(|x[i]|)$. The software
model 600 may represent the LUT 520 as an arbitrary
function 620 with respect to its input |x[i]|. The LUT 520
operation can be represented as an NN layer in the param-
eterized model 170 and, in some instances, can be trained
using another NN as will be discussed more fully below with
reference to FIGS. 7-9.

In the second part 604, the multiplexer 510 operations on
the DPD hardware may select one signal x[n−i] from among
a plurality of input signals x[n], x[n−1], x[n−2], . . . , x[n−M]
based on the selection signal 511. The software model 600
may represent the multiplexer 510 operations as a set of
weights 624, shown as w[0], w[1], w[2], . . . , w[M],
multiplied by the input signal [n], x[n−1], x[n−2], . . . ,
x[n−M] at the multipliers 622, and the products are summed
at an added 626 as shown by 610. As further shown, the
weight w[i]=1 and all other weights w[k≠i]=0, and hence the
output of the adder 626 corresponds to the selected signal
x[n−i]. The software model 600 may also model the signal
selection operations of the multiplexer 512 of FIG. 5 using
similar operations as shown by 610. In general, the software
model 600 may model the multiplexers 510 and/or 512
operations in a wide variety of ways to provide the same
signal selection functionalities. The multiplexer 510 opera-
tions (for memory term selection) can be represented as an
NN layer in the parameterized model 170 and the weights
w[0], w[1], w[2], . . . , w[M] can be trained as part of the
model architecture search as a will be discussed more fully
below with reference to FIGS. 7-9.

Example Automatic Model Discovery for DPD Arrange-
ments

Figure 7:
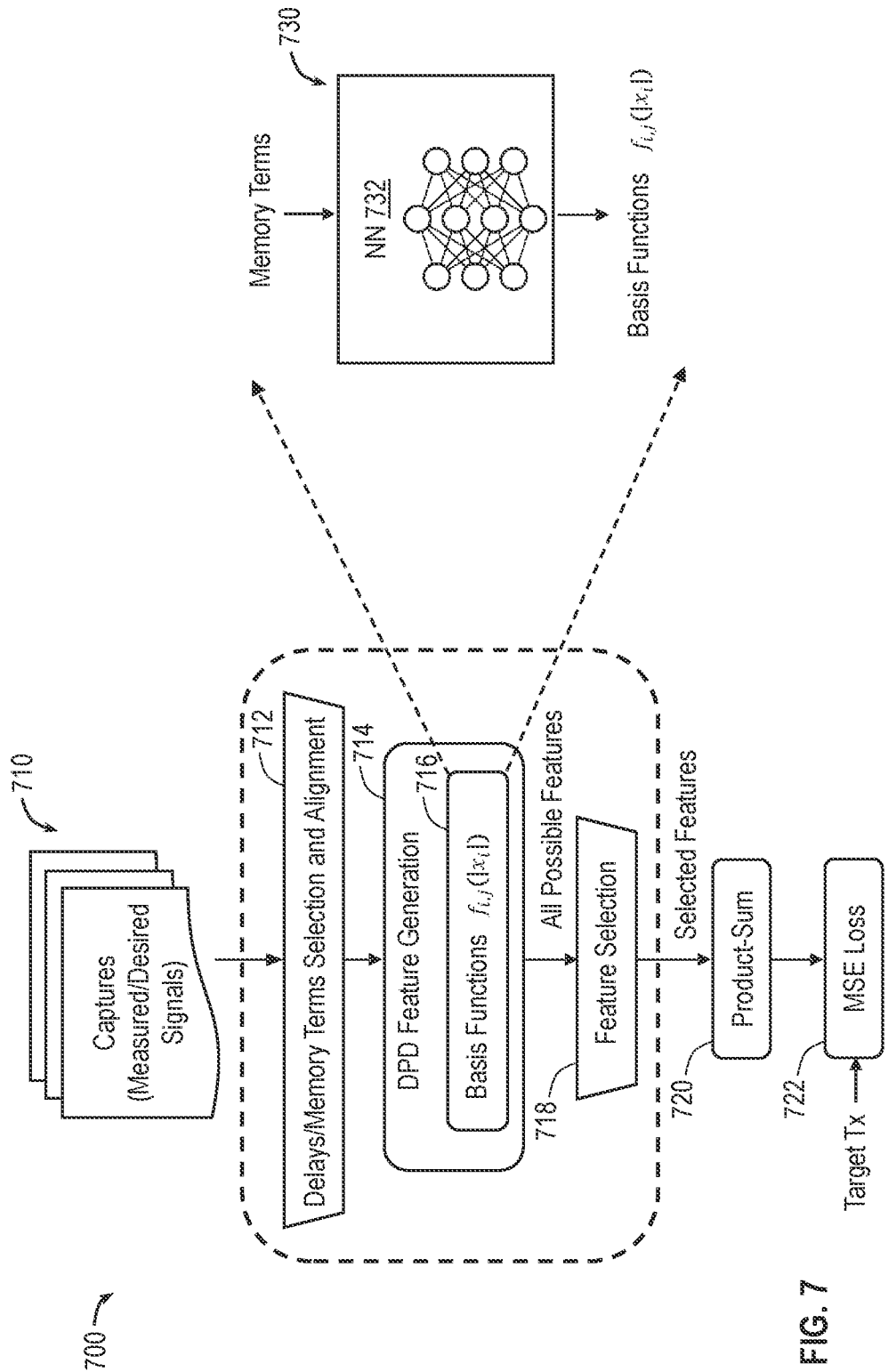
FIG. 7 provides an illustration of an exemplary method for training a parameterized model for DPD operations, according to some embodiments of the present disclosure.

FIG. 7 provides an illustration of an exemplary method
700 for training a parameterized model for DPD operations,
according to some embodiments of the present disclosure.
The method 700 may be implemented by a computer-
implemented system (e.g., the parameterized model training
system 172 of FIG. 1A and/or the data processing system
2300 shown in FIG. 15). In some aspects, the method 700
may be implemented as part of the offline training shown in
FIGS. 2A and/or 2B. At a high level, the method 700
performs a model architecture search to optimize a hardware
configuration for a DPD hardware (e.g., the DPD actuator
circuit 112 and the DPD adaptation circuit 114 of FIGS.
1A-1C and 2A-2B) to pre-compensate nonlinearities of a PA
(e.g., the PA 130 of FIGS. 1A-1C and 2A-2B). The method
700 may replicate the hardware operations of the DPD
actuation circuit 112 and/or DPD adaptation circuit 114.

In some aspects, the computer-implement system may
include memory storing instruction and one or more com-
puter processors, where the instructions, when executed by
the one or more computer processors, cause the one or more
computer processors to perform the operations of the
method 700. In other aspects, the operations of the method
700 may be in the form of instructions encoded in a non-transitory computable-readable storage medium that,
when executed by one or more computer processors of the
computer-implemented system, cause the one or more com-
puter processors to perform the method 700.

At 710, the computer-implemented system may receive
captures of measured signals and/or desired signals collected
on a target hardware. The target hardware may be similar to
the RF transceiver 100 of FIG. 1, the indirect learning DPD
180 of FIG. 1B, and/or the direct learning DPD 190 of FIG.
1C. The captures may be similar to the captures 202. In
particular, the captures may include the input signal 102 x,
pre-distorted signal 104 z, and/or the feedback signal 151 y'
captured from the target hardware and/or corresponding
desired signals.

At 712, the computer-implemented system may generate
delayed versions of the captured signals (to replicate the
tapped delay line 312), select memory terms (to replicate the
multiplexer 510 and 512 operations) from the captured
signals, and/or align the captured signals (according to a
certain reference sample time).

At 714, the computer-implemented system may perform
DPD feature generation. The DPD feature generation may
include applying various basis functions 716 (e.g., $f_{i,j}(P(x_i))$)
to generate features (or nonlinear characteristics) associated
with the PA 130. The DPD feature generation may output all
possible features.

At 718, the computer-implemented system may perform
feature selection. For example, the feature selection may
select one or more features from the possible features output
by the DPD feature generation. The selection may be based
on a certain criteria or threshold, for example, when certain
order of nonlinearities or combination of nonlinearities
exceed a threshold. In some examples, if the features output
by the feature generation at 714 indicate the presence of a
third order nonlinearity but not a fifth order nonlinearity,
then the feature selection may select features associated with
the third order nonlinearities. Further, a set of basis functions
may be generated for third order nonlinearities. As another
example, if the features output by the feature generation
indicate the presence of a third order nonlinearity and a fifth
order nonlinearity, then the feature selection may select
features associated with the third order nonlinearities and
features of associated with the fifth order nonlinearities.
Further, a set of basis functions may be generated for third
order nonlinearities and another set of basis functions may
be generated for fifth order nonlinearities. As a further
example, if the features output by the feature generation
indicate a correlation between a third order nonlinearity and
a fifth order nonlinearity, then the feature selection may
select features associated with the third order nonlinearities
and features of associated with the fifth order nonlinearities.
Further, a set of basis functions may be generated for both
the third order and fifth order nonlinearities.

At 720, the computer-implemented system may compute
a product-sum to generate a pre-distorted signal 104 as
shown in FIG. 5 based on the selected features (e.g., memory
terms and basis functions) output by the feature selection
and the DPD coefficients.

At 722, the computer-implemented system may determine
a mean-squared error (MSE) loss (e.g., a difference between
a target or desired transmit signal and the pre-distorted
signal).

The computer-implemented system may perform back-
propagation to adjust the feature selection at 718, the feature
generation 714, and/or the delays/memory term selection at
712 and may repeat the method 700 until the MSE loss
satisfies certain criteria (e.g., a threshold).

In some aspects, the computer-implemented system may train an NN 732 to generate the basis functions as sown by 730. To that end, the NN 732 may take various memory terms of the input signal 102 x and/or the feedback signal 151 y' as inputs to the NN 732 and the NN 732 may generate basis functions $f_{i,j}(|x_i|)$. In this case, the basis functions may be any arbitrary functions and not necessarily be mathematically expressible as polynomials.

Figure 8:
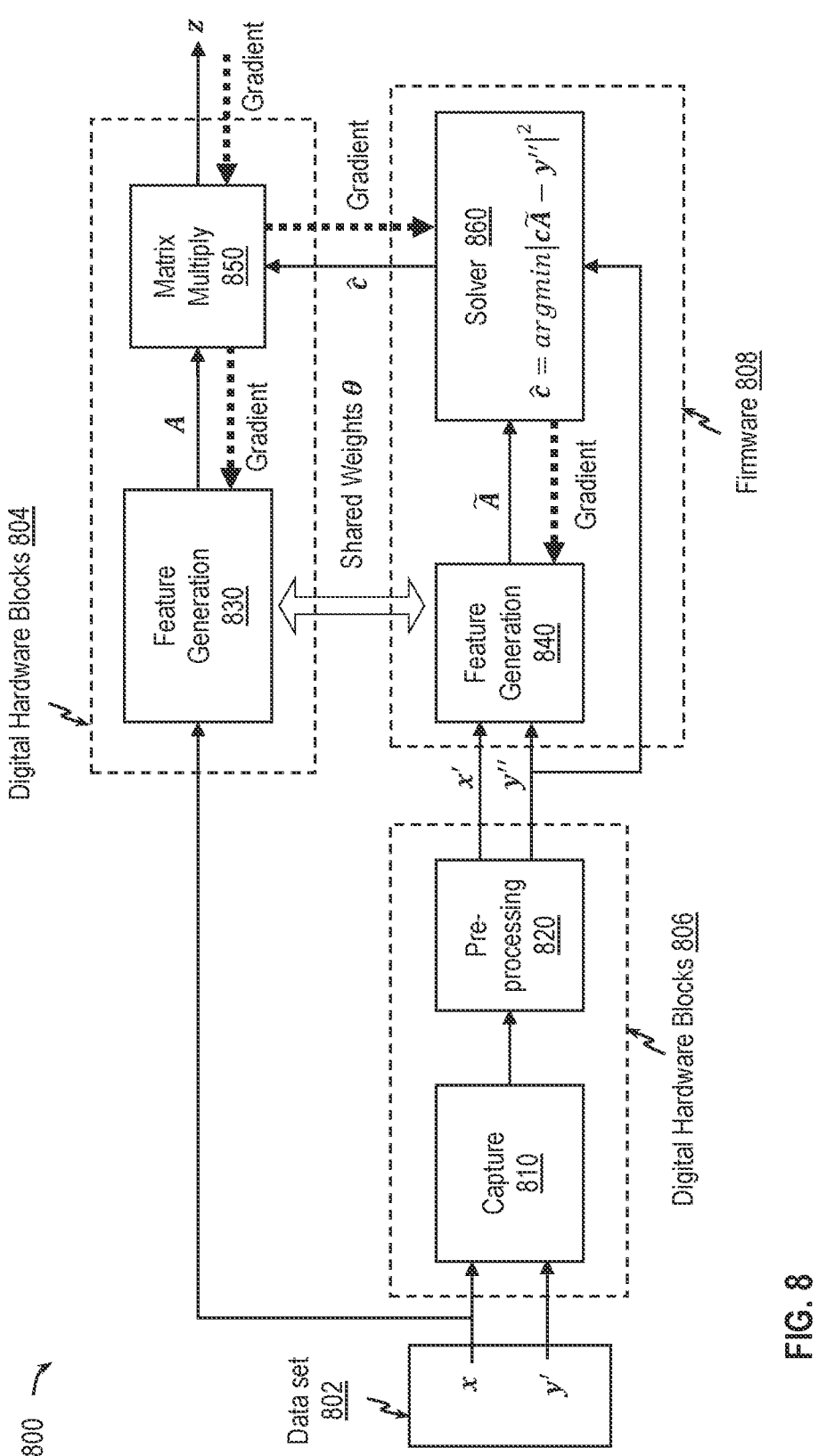
FIG. 8 provides a schematic illustration of an exemplary parametrized model modelling DPD operations as a sequence of differentiable functional blocks, according to some embodiments of the present disclosure.

FIG. 8 provides a schematic illustration of an exemplary parametrized model 800 modelling DPD operations as a sequence of differentiable functional blocks, according to some embodiments of the present disclosure. The model 800 may be generated by a computer-implemented system (e.g., the parameterized model training system 172 of FIG. 1A and/or the data processing system 2300 shown in FIG. 15). The model 800 may be similar to the parameterized model 170. In some aspects, the parametrized model 800 may be generated as part of the offline training shown in FIGS. 2A and/or 2B. At a high level, a DPD hardware (e.g., the DPD circuit 110) may include a pool of processing units (e.g., including digital hardware blocks or circuits, analog circuits, ASIC(s), FPGA(s), and/or processor(s) executing a firmware), and the model 800 may map each of the processing units to a different one of a plurality of differentiable functional blocks. In some aspects, the computer-implemented system may utilize substantially similar mechanisms as in the offline training of FIGS. 2A-2B and/or the method 700 of FIG. 7 to generate the parametrized model 800

As shown in FIG. 8, the model 800 models DPD actuation as a feature generation 830 parameterized by learnable parameters or weights θ and a matrix multiply 850 carried out on digital hardware blocks 804. For example, the digital hardware blocks 804 may correspond to digital circuits in the DPD actuator circuit 112. The model 800 further models DPD adaptation as differentiable functional blocks replicating a DPD adaptation procedure carried out on digital hardware blocks 806 and a firmware 808 running on a processor. For example, the digital hardware blocks 806 and the processor that run the firmware 808 may correspond to digital circuits and processor(s) in the DPD adaptation circuit 114. In some aspects, the digital hardware blocks 804 and the digital hardware blocks 806 may correspond to the same digital hardware blocks. In other aspects, at least one digital hardware block of the digital hardware blocks 804 is not part of the digital hardware blocks 806.

As further shown in FIG. 8, the model 800 may receive a data set 802. The data set 802 may be substantially similar the captures 202 of FIGS. 2A-2B and/or the captures at 710. For instance, the data set 802 may include captures of the input signal 102 x and/or the feedback signal 151 y' measured from the target hardware (e.g., the RF transceiver 100). For DPD actuation, the model 800 may perform feature generation 830 (parameterized by learnable parameters or weights θ) based on the input signal 102 x to output a feature matrix A. The model 800 may perform a matrix multiply 850 between the feature matrix A and a set of coefficients ĉ.

The model 800 may model the capture operation 810 and the pre-processing operations 820 that are performed on the digital hardware blocks 806. The pre-processing operations 820 may pre-process the input signal 102 x and the feedback signal 151 y' and output pre-processed signal x' and y", respectively. In some aspects, the pre-processing operations 820 may include time-aligning the feedback signal 151 y' to the input signal 102 x. The pre-processing operations 820 may depend on whether direct learning DPD or indirect learning DPD is used. For direct learning DPD, the output pre-processed signal x' may correspond to the input signal 102 x, and the output pre-processed signal y" may correspond to the difference between the input signal 102 x and the feedback signal 151 y' after the alignment. For indirect learning DPD, the output pre-processed signal x' may correspond to the feedback signal 151 y', and the output pre-processed signal y" may correspond to the input signal 102 x. For DPD adaptation, the model 800 may include performing the feature generation 840 and the solver 860 that are part of a DPD adaption firmware (e.g., instruction codes for execution on processor(s) for online operations). As shown, the model 800 may perform feature generation 840 (parameterized by the same learnable parameters or weights θ as the feature generation 830 for DPD actuation) based on the output pre-processed signal x' to output a feature matrix A. Stated differently, the feature matrix may be generated from the input signal 102 x for direct learning DPD or from the feedback signal 151 y' for indirect learning DPD. The model 800 may further apply a solver 860 to solve for the coefficients ĉ, where ĉ=argmin|cÃ−y"|² when using an indirect learning DPD architecture. In other instances, the solver 860 may solve for the coefficients c using an iterative solution (e.g., ĉ$^{(t+1)}$=ĉ$^{(t)}$+argmin|cÃ−y"| ") when using a direct learning DPD architecture. The model 800 may further provide the updated coefficients @ for DPD actuation (e.g., used for the matrix multiply 850). The computer-implemented system may optimize the parameters (e.g., θ) of the model 800 by performing a gradient descent search with backpropagation as shown by the dotted arrows.

Figure 9:
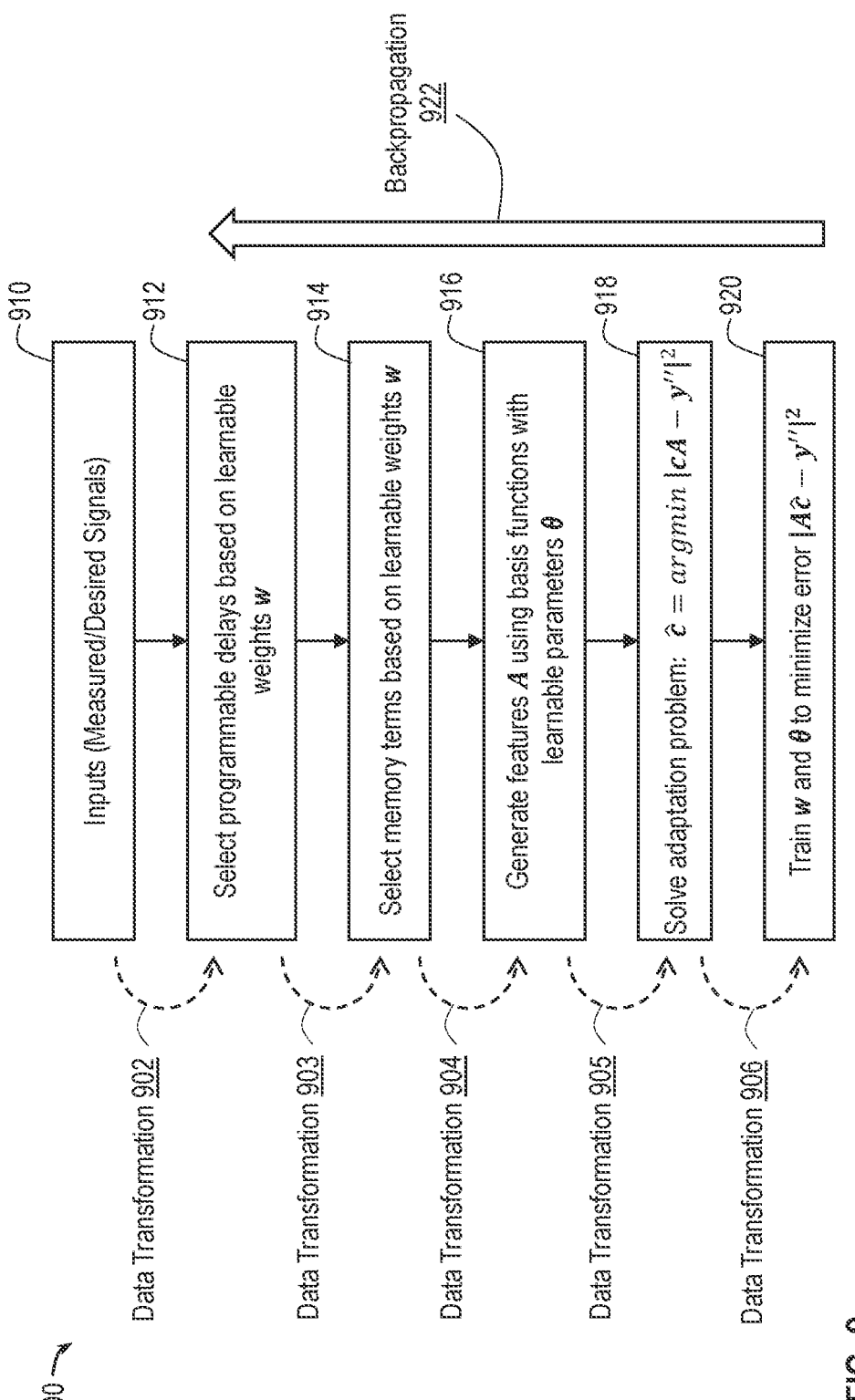
FIG. 9 is a flow diagram illustrating an exemplary method for training a parameterized model for DPD operations, according to some embodiments of the present disclosure.

FIGS. 9 and 10 are discussed in relation to each other to illustrate a model architecture search procedure performed offline for a target DPD hardware and corresponding online DPD operations on the target DPD hardware. The target hardware may include a pool of processing units that can perform arithmetic operations and/or signal selection operations (e.g., multiplexing and/or de-multiplexing) for performing DPD actuation and DPD adaptation. The pool of processing units may include digital circuits, analog circuits, processor(s), ASIC(s), FPGA(s), etc. In certain aspects, the target DPD hardware may include digital circuits and at least a processor that can execute instruction codes.

FIG. 9 provides a flow diagram illustrating an exemplary method 900 for training a parameterized model for DPD, according to some embodiments of the present disclosure. The method 900 may be implemented by a computer-implemented system (e.g., the parameterized model training system 172 of FIG. 1A and/or the data processing system 2300 shown in FIG. 15). In some aspects, the method 900 may be implemented as part of the offline training shown in FIGS. 2A and/or 2B. At a high level, the method 900 performs a model architecture search to optimize a hardware configuration for a DPD hardware (e.g., the DPD actuator circuit 112 and the DPD adaptation circuit 114 of FIGS. 1A-1C and 2A-2B) to pre-compensate nonlinearities of a PA (e.g., the PA 130 of FIGS. 1A-1C and 2A-2B). The method 900 may replicate the hardware operations of the DPD actuation circuit 112 and/or DPD adaptation circuit 114 and perform a model architecture for configuring the actual DPD actuation circuit 112 and/or DPD adaptation circuit 114 for online operations. The method 900 may utilize similar mechanisms as in the method 700 of FIG. 7 and the model 800 of FIG. 8.

In some aspects, the computer-implement system may include memory storing instructions and one or more computer processors, where the instructions, when executed by the one or more computer processors, cause the one or more computer processors to perform the operations of the method 900. In other aspects, the operations of the method 900 may be in the form of instructions encoded in a non-transitory computable-readable storage medium that, when executed by one or more computer processors of the computer-implemented system, cause the one or more computer processors to perform the method 900.

At 910, the computer-implemented system may receive inputs including measured signals collected from a target hardware and/or desired signals. The target hardware may be similar to the RF transceiver 100 of FIG. 1, the indirect learning DPD 180 of FIG. 1B, and/or the direct learning DPD 190 of FIG. 1C. The inputs may be similar to the captures 202 and/or data 802. In an example, the inputs may include captures of an input signal 102 x (for input to a PA 130) and an observed received signal or feedback signal 151 y' indicative of an output of the PA 130 and/or desired signals (e.g., desired PA input and/or output signals).

At 912, the computer-implemented system may select programmable delays based on learnable weights w. In an example, the programmable delays may correspond to the tapped delay line 312 of FIGS. 3-5, and the learnable weights w may correspond to the weights w used for modelling signal selections at the multiplexers 510 and 512 as shown in FIG. 6.

At 914, the computer-implemented system may select memory terms based on learnable weights w. The memory terms may correspond to the combination of i,j cross-memory terms discussed above with reference to FIGS. 2A-2B and 3-5.

At 916, the computer-implemented system may generate features A using basis functions with learnable parameters θ, for example, similar to the feature generation 840 of FIG. 8. As explained above, the feature generation 840 may be implemented by executing firmware or instruction codes on processor(s) during online operations.

At 918, the computer-implemented system may solve for the adaptation problem of $\hat{c}$=argmin $|Ac-y''|^2$, for example, similar to the solver 860 of FIG. 8.

At 920, the computer-implemented system may train the learnable parameters w and θ to minimize an error represented by $|Ac-y''|^2$.

In an aspect, the operations at 910, 912, 914, 916, 918, and 920 of the method 900 may be viewed as a sequence of data transformations 902, 903, 904, 905, and 906, which may be mapped to a sequence of NN layers. As such, the computer-implemented system may further perform back-propagation 922 from 920 back to 912 to adjust or update the learnable parameters w and θ. As part of the backpropagation 922, the computer-implemented system may update the learnable parameters w for memory term selections. For example, if the gradient with respect to the parameters w is towards a certain direction, the backpropagation 922 may optimize parameters w towards that direction. In a similar way, if the gradient with respect to the parameters θ is towards a certain direction, the backpropagation 922 may optimize parameters θ towards that direction. After the backpropagation, the method of 900 may be repeated and followed by another backpropagation 922, if needed. In general, this process may continue until the error at 920 satisfies certain criteria during which the learnable parameters w and θ are considered trained. The trained parameterized model is then ready to be used for inference (e.g., to configure the DPD hardware). Phrased differently, the method 900 trains a parameterized model (e.g., the parameterized model 170) represented by the parameters w and θ by replicating DPD hardware operations, and the trained parameterized model (e.g., the trained parameters w and θ)

can be used to configure the actual DPD hardware circuits for online adaptation and actuation.

FIG. 10 provides a flow diagram illustrating an exemplary method for 1000 performing DPD operations for online actuation and adaptation, according to some embodiments of the present disclosure. The method 1000 may be implemented by a DPD apparatus (e.g., the DPD circuit 110, the indirect learning DPD 180, and/or the direct learning DPD 190). The DPD apparatus may be LUT-based, for example, including a LUT-based DPD actuator similar to the LUT-based DPD actuator 500 of FIG. 5. In some aspects, the method 1000 may be implemented as part of the online adaptation and actuation shown in FIGS. 2A and/or 2B. As will be seen below, the operations of the method 1000 performs on the DPD apparatus correspond to the operations of the method 900 used for training the parameterized model (e.g., the learnable parameters w and θ), and the trained parameters w and θ are directly used in the online operations.

At 1002, the DPD apparatus receives inputs of measured and/or desired signals. In some examples, the inputs may include an input signal 102 x received from an input node of the DPD apparatus. In some examples, the inputs may be obtained from a capture buffer (e.g., the capture buffer 220) of the DPD apparatus. The inputs may include captures of an input signal 102 x (for input to a PA 130) and an observed received signal or feedback signal 151 y' indicative of an output of the PA 130 and/or desired signals (e.g., desired PA input and/or output signals).

At 1004, the DPD apparatus may generate memory terms and delayed samples based on the trained weights w, for example, corresponding to the operations at 914 of the method 900. The memory terms may correspond to the combination of i,j cross-memory terms discussed above with reference to FIGS. 2A-2B and 3-5.

For DPD actuation, at 1012, the DPD apparatus may configure an actuator (e.g., the DPD actuator circuit 112) of the DPD apparatus based on the selected memory terms. For instance, the actuator may be implemented as shown in FIG. 5, and the DPD apparatus may configure the programmable delays (e.g., the delays 312) and multiplexers (e.g., the multiplexers 510 and 512) based on the selected memory terms. In some instances, the DPD apparatus may also configure LUTs to store a combination of basis functions and coefficients (e.g., as shown in equation (2)).

For DPD adaptation, at 1006, the DPD apparatus may generate features A using basis functions with trained parameters θ, for example, corresponding to the operations at 916 of the method 900. At 1008, the DPD apparatus may solve for the adaptation problem of @=argmin $|Ac-y''|^2$, for example, corresponding to the operations at 918 of the method 900. At 1010, the DPD apparatus may program LUT values (for the LUT(s) at the DPD apparatus) based on the solved coefficients $\hat{c}$, for example, as shown in equation (2).

Example Differentiable Sequential Operations

Sequential operations may be modeled as a differentiable computational graph. The same sequence of operations may be reproduced with differentiable functional blocks. While the mapping of sequential hardware operations differentiable functional blocks discussed above with reference to FIGS. 6-10 are discussed in the context of DPD actuation and DPD adaptation, similar techniques can be any suitable hardware operations. Some examples of differentiable sequential operations are shown in FIGS. 11 and 12.

Figure 11:
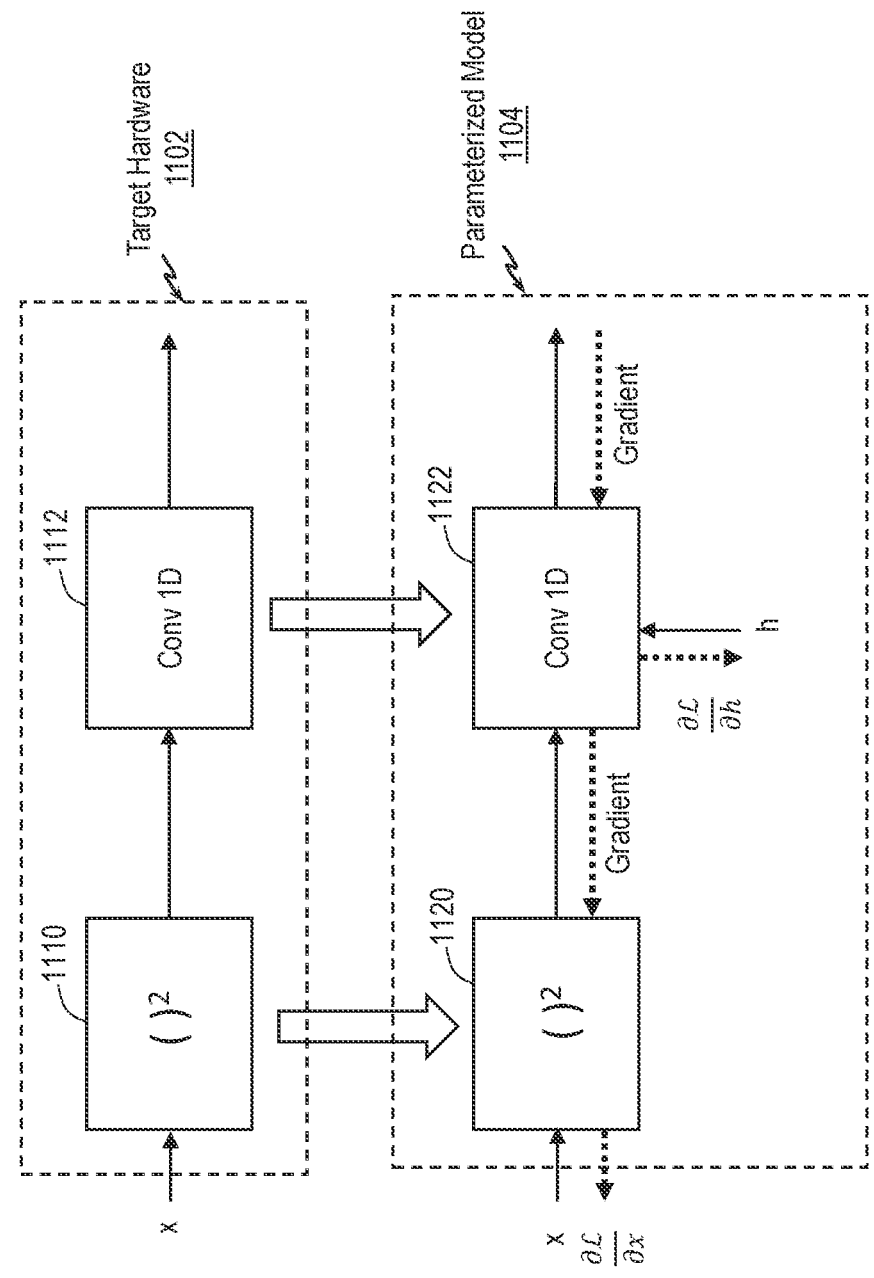
FIG. 11 provides a schematic illustration of an exemplary mapping of a sequence of hardware blocks to a sequence of differential functional blocks, according to some embodiments of the present disclosure.
Figure 12:
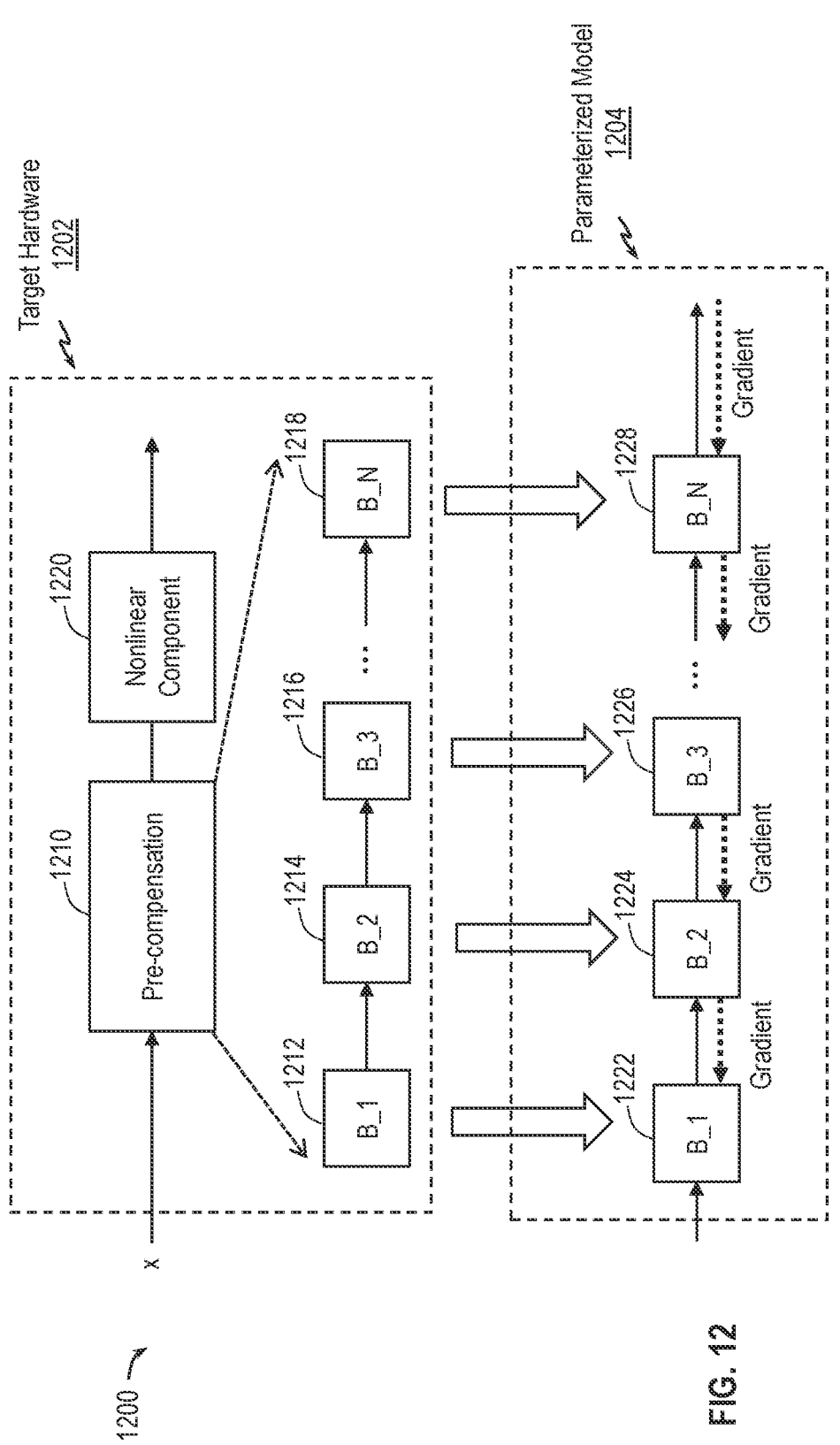
FIG. 12 provides a schematic illustration of an exemplary mapping of a sequence of hardware blocks to a sequence of differential functional blocks, according to some embodiments of the present disclosure.

FIG. 11 provides schematic illustration of an exemplary mapping 1100 of a sequence of hardware blocks to a sequence of differential functional blocks, according to some embodiments of the present disclosure. As shown in FIG. 11, a target hardware 1102 may perform a quadratic function 1110 on an input signal x, followed by a finite impulse response (FIR) filter 1112 (shown as Conv 1D), which is a one-dimensional (1D) convolution. The FIR filter 1112 may include filter coefficients, which may be represented by h. These hardware operations can be mapped to a parameterized model 1104 with a 1-1 correspondence between the hardware operations and the differentiable functional blocks. As shown, the sequence of the quadratic function 1110 and FIR 1112 on the hardware is mapped to a sequence of differentiable functional blocks 1120 and 1122, respectively, in the parameterized model 1104. A gradient descent algorithm can be applied with backpropagation with respect to a loss function £ as shown by the dotted arrows to optimize the parameterized model 1104. For example, the output of the operations of the quadratic function 1110 and FIR 1112 may be compared with a desired reference signal and the error may be calculated with a function £ and the gradients with respect to h (e.g., $$\frac{\partial \mathcal{L}}{\partial h}\big)$$

and with respect to x (e.g., $$\frac{\partial \mathcal{L}}{\partial x}\big)$$

may be calculated as part of the backpropagation. After the parameterized model 1104 is trained, the target hardware 1102 may be configured according to the trained parameterized model 1104 (e.g., trained FIR coefficients).

FIG. 12 provides a schematic illustration of an exemplary mapping 1200 of a sequence of hardware blocks to a sequence of differential functional blocks, according to some embodiments of the present disclosure. As shown in FIG. 12, a target hardware 1202 may perform a pre-compensation 1210 (e.g., DPD) to linearize certain nonlinearities of a downstream nonlinear component 1220 (e.g., the PA 130). The pre-compensation 1210 may include a sequence of data transformations B_1 1212, B_2 1214, B3_1216, . . . , B_N 1218 applied on an input signal x. At least some of these data transformations may be configured based on learnable parameters. These hardware operations can be mapped to a parameterized model 1204 with a 1-1 correspondence between the hardware operations and the differentiable functional blocks. As shown, the sequence of data transformations B_1 1212, B_2 1214, B3_1216, . . . , B_N 1218 on the hardware is mapped to a sequence of differentiable functional blocks 1222, 1224, 1226, . . . , 1228, respectively, in the parameterized model 1204. A gradient descent algorithm can be applied with backpropagation as shown by the dotted arrows to optimize the learnable parameters in parameterized model 1204. After the parameterized model 1104 is trained, the target hardware 1102 may be configured according to the parameterized model 1104 (e.g., trained parameters).

Example Methods for Training a Parameterized Model Mapped to a Target Hardware and Applying the Trained Parameterized Model to the Target Hardware FIG. 13 provides a flow diagram illustrating a method 1300 for training a parameterized model mapped to a target hardware, according to some embodiments of the present disclosure. The method 1300 may be implemented by a computer-implemented system (e.g., the parameterized model training system 172 of FIG. 1A and/or the data processing system 2300 shown in FIG. 15). In some aspects, the method 1300 may be implemented as part of the offline training shown in FIGS. 2A and/or 2B. At a high level, the method 1300 performs a model architecture search to optimize a hardware configuration for a DPD hardware (e.g., the DPD actuator circuit 112 and the DPD adaptation circuit 114 of FIGS. 1A-1C and 2A-2B) to pre-compensate nonlinearities of a PA (e.g., the PA 130 of FIGS. 1A-1C and 2A-2B). Operations are illustrated once each and in a particular order in FIG. 13, but the operations may be performed in parallel, reordered, and/or repeated as desired.

In some aspects, the computer-implement system may include memory storing instruction and one or more computer processors, where the instructions, when executed by the one or more computer processors, cause the one or more computer processors to perform the operations of the method 1300. In other aspects, the operations of the method 1300 may be in the form of instructions encoded in a non-transitory computable-readable storage medium that, when executed by one or more computer processors of the computer-implemented system, cause the one or more computer processors to perform the method 1300.

At 1302, the computer-implemented system may receive information associated with a pool of processing units. The pool of processing units may be a target hardware for which a parameterized model (e.g., the parameterized model 170) is to be trained using model architecture search (e.g., DNAS) techniques. The pool of processing units may include digital circuits, analog circuits, processor(s) for executing instruction codes (e.g., firmware), ASIC(s), FPGAs, etc. The pool of processing units may perform one or more arithmetic operations and one or more signal selection operations. The information may include hardware constraints, hardware operations, hardware capabilities.

At 1304, the computer-implemented system may receive a data set associated with a data transformation operation (e.g., nonlinear operations, linear operations). The data set may include input signals, output signals corresponding to the input signals measured from the target hardware and/or desired signals. In an example, the data transformation operation may be a DPD operation, and the data set may include captures of an input signal 102 x (for input to a PA 130) and an observed received signal or feedback signal 151 y' indicative of an output of the PA 130 and/or desired signals (e.g., desired PA input and/or output signals).

At 1306, the computer-implemented system may train a parameterized model associated with the data transformation operation based on the data set and the information associated with the pool of processing units. The training may include updating at least one parameter (e.g., a learnable parameter) of the parameterized model associated with configuring at least a subset of the processing units in the pool.

At 1308, the computer-implemented system may output, based on the training, one or more configurations for at least the subset of the processing units in the pool. For instance, the one or more configurations may indicate information associated with at least some learnable parameters updated from the training.

In some aspects, the method 1300 may further generate the parameterized model. The generating may include generating a mapping between each of the processing units in the pool to one of a plurality of differentiable functional blocks, for example, as discussed above with reference to FIGS. 8-12.

In some aspects, the data transformation operation may include a sequence of at least a first data transformation and a second data transformation, and the training at 1306 may include calculating a first parameter (e.g., a learnable parameter) associated with the first data transformation and a second parameter (e.g., a learnable parameter) associated with the second data transformation. In some aspects, the calculating the first parameter associated with the first data transformation and the second parameter associated with the second data transformation is further based on a backpropagation and a loss function. In some aspects, the first data transformation or the second data transformation in the sequence is associated with an executable instruction code. In some examples, the first data transformation may be performed by digital circuits at the target hardware, and the second data transformation may be implemented in a firmware the is executed by a processor at the target hardware.

In certain aspects, the data transformation operation is associated with a DPD (e.g., the DPD circuit 110, the direct learning DPD 180, and/or the DPD 190) for pre-distorting an input signal to a nonlinear electronic component. For instance, the input signal may correspond to the input signal 102 x and the nonlinear electronic component may correspond to the PA 130 as discussed herein. In a first example, the data transformation may correspond to a DPD actuation. Accordingly, the first data transformation in the sequence may include selecting memory terms (e.g., i,j cross-memory terms as discussed above) from the input signal based on the first parameter (e.g., the learnable weights w as discussed above with reference to FIG. 9). The second data transformation in the sequence may include generating features (e.g., the feature matrix A as discussed above with reference to FIGS. 8-9) associated with a nonlinear characteristic of the nonlinear electronic component using a set of basis functions and the selected memory terms, where the generating may be based on the second parameter (e.g., the learnable parameters θ as discussed above with reference to FIGS. 8-9). The sequence associated with the data transformation operation may further include a third data transformation comprising generating a pre-distorted signal based on the features.

In a second example, the data transformation may correspond to a DPD adaptation. Accordingly, the first data transformation in the sequence may include selecting memory terms from a feedback signal (e.g., the feedback signal 151 y') indicative of an output of the nonlinear electronic component or the input signal, where the selecting is based on the first parameter (e.g., (e.g., the learnable weights w as discussed above with reference to FIG. 9). The second data transformation in the sequence may include generating features (e.g., the feature matrix A as discussed above with reference to FIGS. 8-9) associated with a nonlinear characteristic of the nonlinear electronic component using a set of basis functions and the selected memory terms, where the generating may be based on the second parameter (e.g., the learnable parameters θ as discussed above with reference to FIGS. 8-9). The sequence associated with the data transformation operation may further include a third data transformation comprising updating coefficients (e.g., the coefficients c as discussed above with reference to FIGS. 1A-1C, 2A-2B, 8-9) based on the features and a second signal. In an example for an indirect learning DPD, the first data transformation may include selecting, based on the first parameter, the memory terms from the feedback signal, and the third data transformation comprising updating the coefficients based on a pre-distorted signal (e.g., the signal 104 z) generated from the DPD as discussed above with reference FIG. 1B. In an example for direct learning DPD, the first data transformation may include selecting, based on the first parameter, the memory terms from the input signal, and the third data transformation may include updating the coefficients based on a difference between the feedback signal and the input signal as discussed above with reference to FIG. 1C. In some aspects, as part of training the parameterized model at 1306, the computer-implemented system may perform the backpropagation to update the second parameter to generate the set of basis functions, for example, as discussed above with reference to FIGS. 7 and 9. In some aspects, as part of outputting the one or more configurations at 1308, the computer-implemented system may output the one or more configurations may further indicate at least one of a lookup table (LUT) configuration associated with the selection of the memory terms or the set of basis functions. For example, the one or more configurations may be similar to the actuator configuration 212 and/or adaptation engine configuration 214 as discussed above with reference to FIGS. 2A-2B.

FIG. 14 provides a flow diagram illustrating a method 1400 for performing operations on a target hardware (e.g., an apparatus) configured based on a parameterized model, according to some embodiments of the present disclosure. In some aspects, the method 1400 may be implemented by a DPD apparatus (e.g., the DPD circuit 110, the indirect learning DPD 180, and/or the direct learning DPD 190) for which the parameterized model is trained. In some aspects, the method 1400 may be implemented as part of the online adaptation and actuation shown in FIGS. 2A and/or 2B. Operations are illustrated once each and in a particular order in FIG. 14, but the operations may be performed in parallel, reordered, and/or repeated as desired.

At 1402, the apparatus may receive an input signal.

At 1404, the apparatus may configure at least a first subset of processing units in a pool of processing units based on a parameterized model (e.g., the parameterized model 170) associated with a data transformation (e.g., nonlinear operations, linear operations, DPD operations, etc.). The pool of processing units may include digital hardware blocks or digital circuits, analog hardware blocks or analog circuits, processors, ASIC(s), FPGA(s), etc. The first subset of processing units may perform one or more signal selections and one or more arithmetic operations.

At 1406, the apparatus may perform the data transformation on the input signal, where the performing the data transformation may include processing the input signal using the first subset of processing units to generate a first signal.

In some aspects, the method 1400 may include the apparatus configuring a second subset of processing units in the pool of processing units based on the parameterized model, where the performing the data transformation may further include processing the first signal using the second subset of processing units to generate a second signal. That is, the data transformation may include a sequence of data transformations. In some aspects, the first subset of processing units may include digital hardware blocks (e.g., digital circuits), the second subset of processing units comprises one or more processors, and the performing the data transformation may include using the digital hardware blocks to process the input signal to generate the first signal and executing instruction codes on the one or more processors to process the first signal to generate the second signal. In some aspects, the method 1400 may include the apparatus configuring a third subset of processing units in the pool of processing units (e.g., third subset 1626 of processing units in the pool of processing units 1620) based on the parameterized model. The performing the data transformation may further include processing the second signal using the third subset of processing units to generate a third signal. In some aspects, the first subset of the processing units is the same as the third subset of the processing units. In other aspects, at least one processing unit in the first subset of the processing units is not in the third subset of the processing units.

In some aspects, the parameterized model for configuring the first subset of processing units may be trained based on a mapping between each of the processing units in the pool to a different one of a plurality of differentiable building blocks (e.g., as discussed above with reference to FIGS. 2A-2B, 6, 7-12), and at least one of an input data set collected on a target hardware, an output data set collected on the target hardware, or a hardware constraint. In some aspects, the parameterized model for the configuration of the of the first subset of the processing units is further trained based on a NAS over the plurality of differentiable building blocks.

In certain aspects, the apparatus may be a DPD apparatus (e.g., the DPD circuit 110, the indirect learning DPD 180, and/or the direct learning DPD 190) for performing DPD actuation and DPD adaptation. In an example of DPD actuation, the input signal may be associated with an input (e.g., the input signal 102 x) for a nonlinear electronic component (e.g., the PA 130). The processing the input signal to generate the first signal at 1406 may include selecting first memory terms (e.g., i,j cross-memory terms) from the input signal based on the parameterized model (e.g., based on the trained weights w in the parameterized model) and generating a pre-distorted signal (e.g., the output signal 104 z) based on one or more LUTs (e.g., the LUTs 320, 322, 324, 326, 420, 422, and/or 520) associated with one or more nonlinear characteristics of the nonlinear electronic component and the first selected memory terms, where the first signal may correspond to the pre-distorted signal. In some examples, the one or more LUTs may be configured based on the parameterized model (e.g., based on the trained parameter $\theta$ in the parameterized model). In an example for DPD adaptation using indirect learning (e.g., as shown in FIG. 1B), the apparatus may further select second memory terms from a feedback signal associated with the nonlinear electronic component based on the parameterized model (e.g., the trained weights w in the parameterized model). The apparatus may further configure, based on the parameterized model, a second subset of processing units in the pool of processing units to execute instruction codes to calculate DPD coefficients (e.g., the coefficients c) based on the selected second memory terms and a set of basis functions. The instruction codes may also cause the second subset of processing units to update at least one of the one or more LUTs based on the calculated coefficients and the set of basis functions. In an example for DPD adaptation using direct learning (e.g., as shown FIG. 1C), the apparatus may further configure, based on the parameterized model, a second subset of processing units in the pool of processing units to execute instruction codes to calculate DPD coefficients (e.g., the coefficients c) based on the selected first memory terms and a set of basis functions. The instruction codes may also cause the second subset of processing units to update at least one of the one or more LUTs based on the calculated coefficients and the set of basis functions.

FIG. 15 provides a block diagram illustrating an exemplary data processing system 2300 that may be configured to implement, or control, at least portions of hardware block configuration using neural networks, according to some embodiments of the present disclosure. In an example, the data processing system 2300 may be configured to train a parameterized model (e.g., the parameterized model 170) for configuring a target hardware using model architecture search techniques (e.g., DNAS) as discussed herein. In another example, the data processing system 2300 may be configured to configure a DPD hardware based on configurations provided by a trained parameterized model as discussed herein.

As shown in FIG. 15, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to performing DPD using neural networks as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating DPD arrangements for performing DPD using neural networks as shown in FIGS. 1-13, can also include suitable interfaces for receiving, transmitting, and/or otherwise communicating data or information in a network environment so that they can communicate with, e.g., the data processing system 2300.

In certain example implementations, mechanisms performing DPD using neural networks as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 15, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 15, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 15, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 15) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 15 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

EXAMPLES

Example 1 includes an apparatus including an input node to receive an input signal; a pool of processing units to perform one or more arithmetic operations and one or more signal selection operations, where each of the processing units in the pool is associated with at least one parameterized model corresponding to a data transformation operation; and a control block to configure, based on a first parameterized model, a first subset of the processing units in the pool, where the first subset of the processing units processes the input signal to generate a first signal.

In Example 2, the apparatus of Example 1 can optionally include where the first subset of the processing units performs at least a first signal selection operation of the one or more signal selection operations.

In Example 3, the apparatus of any of Examples 1-2 can optionally include where the data transformation operation includes a linear data transformation operation.

In Example 4, the apparatus of any of Examples 1-3 can optionally include where the data transformation operation includes a non-linear data transformation operation.

In Example 5, the apparatus of any of Examples 1-4 can optionally include where the first subset of the processing units includes digital hardware blocks to process the input signal to generate the first signal; and the control block further configures a second subset of the processing units to execute instruction codes to process the first signal to generate a second signal, where the processing the first signal is associated with the first parameterized model.

In Example 6, the apparatus of any of Examples 1-5 can optionally include where a third subset of the processing units processes the second signal to generate a third signal, where the third subset of the processing units is configured based on the first parameterized model.

In Example 7, the apparatus of any of Examples 1-6 can optionally include where the first subset of the processing units is the same as the third subset of the processing units.

In Example 8, the apparatus of any of Examples 1-6 can optionally include where at least one processing unit in the first subset of the processing units is not in the third subset of the processing units.

In Example 9, the apparatus of any of Examples 1-8 can optionally include where the first subset of the processing units includes a set of digital hardware blocks to process the input signal to generate the first signal; and the control block further configures a second subset of the processing units including another set of digital hardware blocks to process the first signal to generate a second signal.

In Example 10, the apparatus of any of Examples 1-9 can optionally include where the first parameterized model for the configuration of the of the first subset of the processing units is trained based on a mapping between each of the processing units in the pool to a different one of a plurality of differentiable building blocks; and at least one of an input data set collected on a target hardware, an output data set collected on the target hardware, or a hardware constraint.

In Example 11, the apparatus of any of Examples 1-10 can optionally include where the first parameterized model for the configuration of the of the first subset of the processing units is further trained based on a neural architecture search over the plurality of differentiable building blocks.

In Example 12, the apparatus of any of Examples 1-11 can optionally include the input signal is associated with an input for a nonlinear electronic component; the apparatus further includes a memory to store, based on the first parameterized model, one or more lookup tables (LUTs) associated with one or more nonlinear characteristics of the nonlinear electronic component; and a digital predistortion (DPD) block including the first subset of the processing units to select, based on the first parameterized model, first memory terms from the input signal; and generate a pre-distorted signal based on the one or more LUTs and the selected first memory terms; and the first signal corresponds to the pre-distorted signal.

In Example 13, the apparatus of any of Examples 1-12 can optionally include where the first subset of the processing units further selects, based on the first parameterized model, second memory terms from a feedback signal associated with an output of the nonlinear electronic component; and the control block further configures, based on the first parameterized model, a second subset of the processing units to execute instruction codes to calculate DPD coefficients based on the selected second memory terms and a set of basis functions; and update at least one of the one or more LUTs based on the calculated coefficients.

In Example 14, the apparatus of any of Examples 1-13 can optionally include where the control block further configures a second subset of the processing units to execute instruction codes to calculate DPD coefficients based on the selected first memory terms and a set of basis functions; and update at least one of the one or more LUTs based on the calculated coefficients.

Example 15 includes an apparatus for applying a digital predistortion (DPD) to an input signal of a nonlinear electronic component, the apparatus including a pool of processing units associated with a parameterized model; and a configuration component to select, based on the parameterized model, at least a subset of the processing units and a second subset of the processing units in the pool, where the first subset of the processing units transforms the input signal into a pre-distorted signal based on the parameterized model and DPD coefficients; and the second subset of the processing units updates the DPD coefficients based at least in part on a feedback signal indicative of an output of the nonlinear electronic component.

In Example 16, the apparatus of Example 15 can optionally include where the first subset of the processing units transforms the input signal into the pre-distorted signal by generating, first memory terms from the input signal based on the parameterized model; and generating the pre-distorted signal based on the first memory terms, a set of basis functions, and the DPD coefficients.

In Example 17, the apparatus of any of Examples 15-16 can optionally include where the first subset of the processing units further generates, based on the parameterized model, second memory terms from the feedback signal or the input signal; and the second subset of the processing units updates the set of coefficients further based on the second memory terms and the set of basis functions.

In Example 18, the apparatus of any of Examples 15-17 can optionally include where the second subset of the processing units updates the set of coefficients further based on the input signal.

In Example 19, the apparatus of any of Examples 15-17 can optionally include where the second subset of the processing units updates the set of coefficients further based on an error indicative of a difference between the feedback signal and the input signal.

In Example 20, the apparatus of any of Examples 15-19 can optionally include memory to capture the feedback signal and at least one of the input signal or the pre-distorted signal, where the first subset of the processing units generates the second memory terms further based on an alignment between the feedback signal and the at least one of the input signal or the pre-distorted signal.

In Example 21, the apparatus of any of Examples 15-20 can optionally include where the first subset of the processing units includes one or more digital hardware blocks to transform the input signal into the pre-distorted signal; and the second subset of the processing units includes at least a processor to execute instruction codes to update the coefficients.

In Example 22, the apparatus of any of Examples 15-21 can optionally include where the parameterized model includes a plurality of differentiable functional blocks having a one-to-one correspondence to the processing units in the pool, and where the parameterized model is trained using a gradient descent search.

Example 23 includes a method including receiving an input signal; configuring, based on a parameterized model associated with a data transformation, at least a first subset of processing units in a pool of processing units, where the first subset of processing units performs one or more signal selections and one or more arithmetic operations; and performing the data transformation on the input signal, where the performing the data transformation includes processing the input signal using the first subset of processing units to generate a first signal.

In Example 24, the method of Example 23 can optionally include configuring, based on the parameterized model, a second subset of processing units in the pool of processing units, where the performing the data transformation further includes processing the first signal using the second subset of processing units to generate a second signal.

In Example 25, the method of any of Examples 23-24 can optionally include where the first subset of processing units includes digital hardware blocks; the second subset of processing units includes one or more processors; and performing the data transformation includes using the digital hardware blocks to process the input signal to generate the first signal; and executing instruction codes on the one or more processors to process the first signal to generate the second signal.

In Example 26, the method of any of Examples 23-25 can optionally include where the parameterized model for configuring the first subset of processing units is trained based on a mapping between each of the processing units in the pool to a different one of a plurality of differentiable building blocks; and at least one of an input data set collected on a target hardware, an output data set collected on the target hardware, or a hardware constraint.

In Example 27, the method of any of Examples 23-26 can optionally include where the input signal is associated with an input for a nonlinear electronic component; the processing the input signal to generate the first signal includes selecting, based on the parameterized model, first memory terms from the input signal; and generating a pre-distorted signal based on one or more lookup tables (LUTs) associated with one or more nonlinear characteristics of the nonlinear electronic component and the first selected memory terms, the first signal corresponding to the pre-distorted signal.

In Example 28, the method of any of Examples 23-27 can optionally include selecting, based on the parameterized model, second memory terms from a feedback signal associated with the nonlinear electronic component; configuring, based on the parameterized model, a second subset of processing units in the pool of processing units to execute instruction codes to calculate DPD coefficients based on the selected second memory terms and a set of basis functions; and update at least one of the one or more LUTs based on the calculated coefficients.

In Example 29, the method of any of Examples 23-27 can optionally include configuring, based on the parameterized model, a second subset of processing units in the pool of processing units to execute instruction codes to calculate DPD coefficients based on the selected first memory terms and a set of basis functions; and update at least one of the one or more LUTs based on the calculated coefficients.

Example 30 includes a method including receiving, by a computer-implemented system, information associated with a pool of processing units; receiving, by the computer-implemented system, a data set associated with a data transformation operation; training, based on the data set and the information associated with the pool of processing units, a parameterized model associated with the data transformation operation, where the training includes updating at least one parameter of the parameterized model associated with configuring at least a subset of the processing units in the pool; and outputting, based on the training, one or more configurations for at least the subset of the processing units in the pool.

In Example 31, the method of Example 30 can optionally include where the pool of processing units performs one or more arithmetic operations and one or more signal selection operations.

In Example 32, the method of any of Examples 30-31 can optionally include generating the parameterized model, where the generating includes generating a mapping between each of the processing units in the pool to one of a plurality of differentiable functional blocks.

In Example 33, the method of any of Examples 30-32 can optionally include where the training the parameterized model is further based on a hardware resource constraint indicated by the information associated with the pool of processing units.

In Example 34, the method of any of Examples 30-33 can optionally include where the data transformation operation includes a sequence of at least a first data transformation and a second data transformation, and where the training includes calculating a first parameter associated with the first data transformation and a second parameter associated with the second data transformation.

In Example 35, the method of any of Examples 30-34 can optionally include where the calculating the first parameter associated with the first data transformation and the second parameter associated with the second data transformation is further based on a backpropagation and a loss function.

In Example 36, the method of any of Examples 30-35 can optionally include where the first data transformation or the second data transformation in the sequence is associated with an executable instruction code.

In Example 37, the method of any of Examples 30-36 can optionally include where the data transformation operation is associated with a digital predistortion (DPD) for pre-distorting an input signal to a nonlinear electronic component; the first data transformation in the sequence includes selecting, based on the first parameter, memory terms from the input signal; the second data transformation in the sequence includes generating, based on the second parameter, features associated with a nonlinear characteristic of the nonlinear electronic component using a set of basis functions and the selected memory terms; and the sequence associated with the data transformation operation further includes a third data transformation including generating a pre-distorted signal based on the features.

In Example 38, the method of any of Examples 30-37 can optionally include where the data transformation operation is associated with a digital predistortion (DPD) for pre-distorting an input signal to a nonlinear electronic component; the first data transformation in the sequence includes selecting, based on the first parameter, memory terms from a feedback signal indicative of an output of the nonlinear electronic component or the input signal; the second data transformation in the sequence includes generating, based on the second parameter, features associated with a nonlinear characteristic of the nonlinear electronic component using a set of basis functions and the selected memory terms; and the sequence associated with the data transformation operation further includes a third data transformation including updating coefficients based on the features and a second signal.

In Example 39, the method of any of Examples 30-38 can optionally include where the first data transformation includes selecting, based on the first parameter, the memory terms from the feedback signal; and the third data transformation including updating the coefficients based on a pre-distorted signal generated from the DPD.

In Example 40, the method of any of Examples 30-39 can optionally include where the first data transformation includes selecting, based on the first parameter, the memory terms from the input signal; and the third data transformation including updating the coefficients based on a difference between the feedback signal and the input signal.

In Example 41, the method of any of Examples 30-40 can optionally include where the training the parameterized model includes performing a backpropagation to update the first parameter for the selection the memory terms.

In Example 42, the method of any of Examples 30-41 can optionally include where the training the parameterized model further includes performing the backpropagation to update the second parameter to generate the set of basis functions.

In Example 43, the method of any of Examples 30-42 can optionally include where the outputting the one or more configurations includes outputting the one or more configurations further indicating at least one of a lookup table (LUT) configuration associated with the selection of the memory terms or the set of basis functions.

Example 44 includes a computer-implemented system including a memory including instructions; and one or more computer processors, where the instructions, when executed by the one or more computer processors, cause the one or more computer processors to perform operations including receiving information associated with a pool of processing units, where the pool of processing units performs one or more arithmetic computations and one or more signal selections; receiving a data set associated with a data transformation; training, based on the data set and the information associated with the pool of processing units, a parameterized model associated with the data transformation, where the training the parameterized model includes updating at least one parameter of the parameterized model associated with configuring at least a subset of the processing units in the pool; and outputting, based on the training, one or more configurations for at least the subset of the processing units in the pool.

In Example 45, the computer-implemented system of Example 44 can optionally include where the operations further include generating the parameterized model by generating a mapping between each of the processing units in the pool to one of a plurality of differentiable functional blocks.

In Example 46, the computer-implemented system of any of Examples 44-45 can optionally include where the data transformation includes a sequence of at least a first data transformation and a second data transformation; and the training the parameterized model includes calculating a first parameter associated with the first data transformation and a second parameter associated with the second data transformation based on a backpropagation and a loss function.

In Example 47, the computer-implemented system of any of Examples 44-46 can optionally include where the subset of the processing units includes one or more digital hardware blocks associated with the first data transformation; and one or more processors for executing instruction codes associated with the second data transformation.

In Example 48, the computer-implemented system of any of Examples 44-47 can optionally include where the data transformation operation is associated with at least one of a digital predistortion (DPD) actuation or a DPD adaptation for pre-distorting an input signal to a nonlinear electronic component; and the outputting the one or more configurations includes outputting at least one of a DPD actuation configuration or a DPD adaptation configuration.

Example 49 includes a non-transitory computable-readable storage medium including instructions that, when executed by one or more computer processors, cause the one or more computer processors to perform operations including receiving information associated with a pool of processing units, where the pool of processing units performs one or more arithmetic computations and one or more signal selections; generating a mapping between each of the processing units in the pool to one of a plurality of differentiable functional blocks; receiving a data set associated with a data transformation; training a parameterized model to configure at least a subset of the processing units in the pool to perform the data transformation, where the training is based on the data set, the information associated with the pool of processing units, and the mapping and includes updating at least one parameter of the parameterized model associated with configuring at least a subset of the processing units in the pool; and outputting, based on the training, one or more configurations for at least the subset of the processing units in the pool.

In Example 50, the non-transitory computable-readable storage medium of Example 49 can optionally include where the data transformation includes a sequence of at least a first data transformation and a second data transformation; and the training further includes updating a first parameter associated with the first data transformation and a second parameter associated with the second data transformation based on back propagation and a loss function.

In Example 51, the non-transitory computable-readable storage medium of any of Examples 49-50 can optionally include where the data transformation operation is associated with a digital predistortion (DPD) for pre-distorting an input signal to a nonlinear electronic component; and the first data transformation in the sequence includes selecting, based on the first parameter, memory terms from the input signal; and the second data transformation in the sequence includes generating, based on the second parameter, features associated with a nonlinear characteristic of the nonlinear electronic component using a set of basis functions and the selected memory terms; and the sequence further includes a third data transformation including generating a pre-distorted signal based on the features.

In Example 52, the non-transitory computable-readable storage medium of any of Examples 49-51 can optionally include where the data transformation is associated with a digital predistortion (DPD) for pre-distorting an input signal to a nonlinear electronic component; the first data transformation in the sequence includes selecting, based on the first parameter, memory terms from a feedback signal indicative of an output of the nonlinear electronic component or the input signal; the second data transformation in the sequence includes generating, based on the second parameter, features associated with a nonlinear characteristic of the nonlinear electronic component using a set of basis functions and the selected memory terms; the sequence further includes a third data transformation including updating coefficients based on the features and a second signal; the first data transformation and the second data transformation are to be performed by the subset of the processing units; and the third data transformation is to be performed by executing instruction codes on at least another processing unit in the pool.

Variations and Implementations

Various embodiments of performing DPD configured based on a model trained using NAS are explained herein with reference to the "input signals for PAs" being drive signals for the PAs, i.e., signals generated on the basis of the input signal x, described herein, to which the DPD arrangement applies predistortion based on the DPD coefficients. However, in other embodiments of DPD configured based on a model trained using NAS, the "input signals for PAs" may be bias signals used to bias the N PAs. Thus, embodiments of the present disclosure also cover DPD arrangements configured based on models trained using NAS similar to the ones described herein and illustrated in the drawings, except that, instead of modifying the drive signals for the PAs, the DPD arrangements may be configured to modify the bias signals for the PAs, which may be done based on control signals generated by a DPD adaptation circuit (e.g., the DPD adaptation circuit, described herein), where the output of a PA is based on the bias signal used to bias the PA. In other aspects of the present disclosure, both drive signals and bias signals for PAs may be adjusted as described herein to implement of DPD using neural networks.

While some of the descriptions are provided herein with reference to PAs, in general, various embodiments of DPD configured based on models using NAS, presented herein, are applicable to amplifiers other than PAs, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to millimeter-wave/5G technologies, in general, various embodiments of DPD using neural networks, presented herein, are applicable to wireless communication systems of any technology or standard other than millimeter-wave/5G, to any wireless RF systems other than wireless communication systems, and/or to RF systems other than wireless RF systems.

While embodiments of the present disclosure were described above with references to exemplary implementations as shown in FIGS. 1A-1C, 2A-2B, and 3-15, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as multiplexers, multipliers, adders, delay taps, filters, converters, mixers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to applying model architecture search for hardware configurations, in various communication systems.

Parts of various systems for using model architecture search techniques for hardware configurations as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses and/or RF transceiver shown in FIGS. 1A-1C, 2A-2B, 3-5, and 15) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. An apparatus comprising:
an input node to receive an input signal;
a pool of processing units to perform one or more arithmetic operations and one or more signal selection operations, wherein each of the processing units in the pool of processing units is associated with at least one parameterized model corresponding to a data transformation operation; and
a control block to configure, based on a first parameterized model, a first subset of the processing units in the pool of processing units,
wherein the first subset of the processing units processes the input signal to generate a first signal.

2. The apparatus of claim 1, wherein the first subset of the processing units performs at least a first signal selection operation of the one or more signal selection operations.

3. The apparatus of claim 1, wherein:
the first subset of the processing units comprises digital hardware blocks to process the input signal to generate the first signal; and
the control block further configures a second subset of the processing units to execute instruction codes to process the first signal to generate a second signal, wherein the processing the first signal is associated with the first parameterized model.

4. The apparatus of claim 3, wherein a third subset of the processing units processes the second signal to generate a third signal, and wherein the third subset of the processing units is configured based on the first parameterized model.

5. The apparatus of claim 1, wherein the first parameterized model for the configuration of the first subset of the processing units is trained based on:
a mapping between each of the processing units in the pool of the processing units to a different one of a plurality of differentiable building blocks; and
at least one of an input data set collected on a target hardware, an output data set collected on the target hardware, or a hardware constraint.

6. The apparatus of claim 1, wherein:
the input signal is associated with an input for a nonlinear electronic component;
the apparatus further comprises:
a memory to store, based on the first parameterized model, one or more lookup tables (LUTs) associated with one or more nonlinear characteristics of the nonlinear electronic component; and
a digital predistortion (DPD) block comprising the first subset of the processing units to:
select, based on the first parameterized model, first memory terms from the input signal; and
generate a pre-distorted signal based on the one or more LUTs and the selected first memory terms; and
the first signal corresponds to the pre-distorted signal.

7. The apparatus of claim 6, wherein:
the first subset of the processing units further selects, based on the first parameterized model, second memory terms from a feedback signal associated with an output of the nonlinear electronic component; and
the control block further configures, based on the first parameterized model, a second subset of the processing units to execute instruction codes to:
calculate DPD coefficients based on the selected second memory terms and a set of basis functions; and
update at least one of the one or more LUTs based on the calculated coefficients.

8. The apparatus of claim 6, wherein the control block further configures a second subset of the processing units to execute instruction codes to:
calculate DPD coefficients based on the selected first memory terms and a set of basis functions; and
update at least one of the one or more LUTs based on the calculated coefficients.

9. An apparatus for digital predistortion (DPD), the apparatus comprising:
a pool of processing units associated with a parameterized model; and
a configuration component to select, based on the parameterized model, at least a first subset of the processing units and a second subset of the processing units in the pool of processing units, wherein:

the first subset of the processing units transforms an input signal of a nonlinear electronic component into a pre-distorted signal based on the parameterized model and DPD coefficients; and the second subset of the processing units updates the DPD coefficients based at least in part on a feedback signal indicative of an output of the nonlinear electronic component.

10. The apparatus of claim 9, wherein the first subset of the processing units transforms the input signal of the nonlinear electronic component into the pre-distorted signal by:

generating first memory terms from the input signal based on the parameterized model; and generating the pre-distorted signal based on the first memory terms, a set of basis functions, and the DPD coefficients.

11. The apparatus of claim 10, wherein:

the first subset of the processing units further generates, based on the parameterized model, second memory terms from the feedback signal or the input signal; and the second subset of the processing units updates the set of coefficients further based on the second memory terms and the set of basis functions.

12. The apparatus of claim 9, wherein:

the first subset of the processing units comprises one or more digital hardware blocks to transform the input signal into the pre-distorted signal; and the second subset of the processing units comprises at least a processor to execute instruction codes to update the DPD coefficients.

13. The apparatus of claim 9, wherein the parameterized model comprises a plurality of differentiable functional blocks having a one-to-one correspondence to the processing units in the pool of processing units, and wherein the parameterized model is trained using a gradient descent search.

14. A method comprising:

receiving an input signal;

configuring, based on a parameterized model associated with a data transformation, at least a first subset of processing units in a pool of processing units, wherein the first subset of processing units performs one or more signal selections and one or more arithmetic operations; and performing the data transformation on the input signal, wherein the performing the data transformation comprises processing the input signal using the first subset of processing units to generate a first signal.

15. The method of claim 14, further comprising:

configuring, based on the parameterized model, a second subset of processing units in the pool of processing units, wherein the performing the data transformation further comprises:

processing the first signal using the second subset of processing units to generate a second signal.

16. The method of claim 15, wherein:

the first subset of processing units comprises digital hardware blocks;

the second subset of processing units comprises one or more processors; and the performing the data transformation comprises:

using the digital hardware blocks to process the input signal to generate the first signal; and executing instruction codes on the one or more processors to process the first signal to generate the second signal.

17. The method of claim 14, wherein the parameterized model for configuring the first subset of processing units is trained based on:

a mapping between each of the processing units in the pool of processing units to a different one of a plurality of differentiable building blocks; and at least one of an input data set collected on a target hardware, an output data set collected on the target hardware, or a hardware constraint.

18. The method of claim 14, wherein the input signal is associated with an input for a nonlinear electronic component, and wherein the processing the input signal to generate the first signal comprises:

selecting, based on the parameterized model, first memory terms from the input signal; and generating a pre-distorted signal based on one or more lookup tables (LUTs) associated with one or more nonlinear characteristics of the nonlinear electronic component and the selected first memory terms, the first signal corresponding to the pre-distorted signal.

19. The method of claim 18, further comprising:

selecting, based on the parameterized model, second memory terms from a feedback signal associated with the nonlinear electronic component; and configuring, based on the parameterized model, a second subset of processing units in the pool of processing units to execute instruction codes to:

calculate DPD coefficients based on the selected second memory terms and a set of basis functions; and update at least one of the one or more LUTs based on the calculated coefficients.

20. The method of claim 18, further comprising:

configuring, based on the parameterized model, a second subset of processing units in the pool of processing units to execute instruction codes to:

calculate DPD coefficients based on the selected first memory terms and a set of basis functions; and update at least one of the one or more LUTs based on the calculated DPD coefficients.

* * * * *